United States Patent [19]

Nakai et al.

[11] Patent Number: 5,191,552
[45] Date of Patent: * Mar. 2, 1993

[54] SEMICONDUCTOR MEMORY DEVICE WITH ADDRESS TRANSITION ACTUATED DUMMY CELL

[75] Inventors: Hiroto Nakai, Kawasaki; Hiroshi Iwahashi, Yokohama; Kazuhisa Kanazawa, Tokyo; Shigeru Kumagai; Isao Sato, both of Kawasaki, all of Japan

[73] Assignee: Kabushiki Kaisha Toshiba, Kanagawa, Japan

[*] Notice: The portion of the term of this patent subsequent to Aug. 13, 2008 has been disclaimed.

[21] Appl. No.: 684,567

[22] Filed: May 31, 1991

Related U.S. Application Data

[63] Continuation of Ser. No. 370,869, Jun. 23, 1989, Pat. No. 5,040,148.

[30] Foreign Application Priority Data

Jun. 24, 1988 [JP] Japan .................................. 63-156539
Jun. 29, 1988 [JP] Japan .................................. 63-161344

[51] Int. Cl.$^5$ ...................... G11C 7/00; G11C 11/413; G11C 16/06
[52] U.S. Cl. ............................ 365/189.01; 365/210; 365/189.07; 365/233.5
[58] Field of Search ................ 365/189.01, 207, 208, 365/210, 189.07, 233.5

[56] References Cited

U.S. PATENT DOCUMENTS

| 4,185,321 | 3/1978 | Iwahashi et al. | 365/204 |
| 4,692,902 | 9/1984 | Tanaka et al. | 365/210 |
| 4,761,765 | 8/1988 | Hashimoto | 365/210 X |
| 4,802,138 | 1/1989 | Shimamune | 365/210 |
| 4,805,143 | 2/1989 | Matsumoto et al. | 365/210 X |
| 4,819,212 | 4/1989 | Nakai et al. | 365/210 X |
| 4,884,241 | 11/1989 | Tanaka et al. | 365/210 |
| 5,040,148 | 8/1991 | Nakai et al. | 365/189.01 |

FOREIGN PATENT DOCUMENTS 0238812 9/1987 European Pat. Off. .
0270750 6/1988 European Pat. Off. .

Primary Examiner—Alyssa H. Bowler
Attorney, Agent, or Firm—Finnegan, Henderson, Farabow, Garrett and Dunner

[57] ABSTRACT

In a semiconductor memory device, a first load circuit is coupled with the column lines, first dummy cells are connected to a dummy column line, a second load circuit is connected to the dummy column line, a second dummy cell is connected to the dummy column line, and a sense amplifier senses the data stored in the memory cell in accordance with a potential difference between the column line and the dummy column line. In semiconductor memory devices thus arranged, the second dummy cell is set in an on state normally. The connection of the second dummy cell with the dummy line changes a current flowing to the dummy line at the time of row line switching, thereby to hold back a rise of the reference potential at the time of the row line switching.

6 Claims, 17 Drawing Sheets

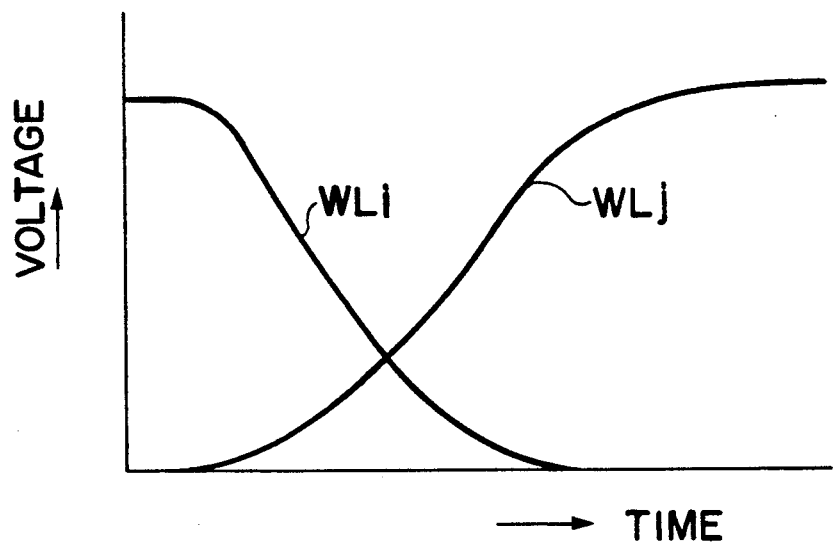
F I G. 8A
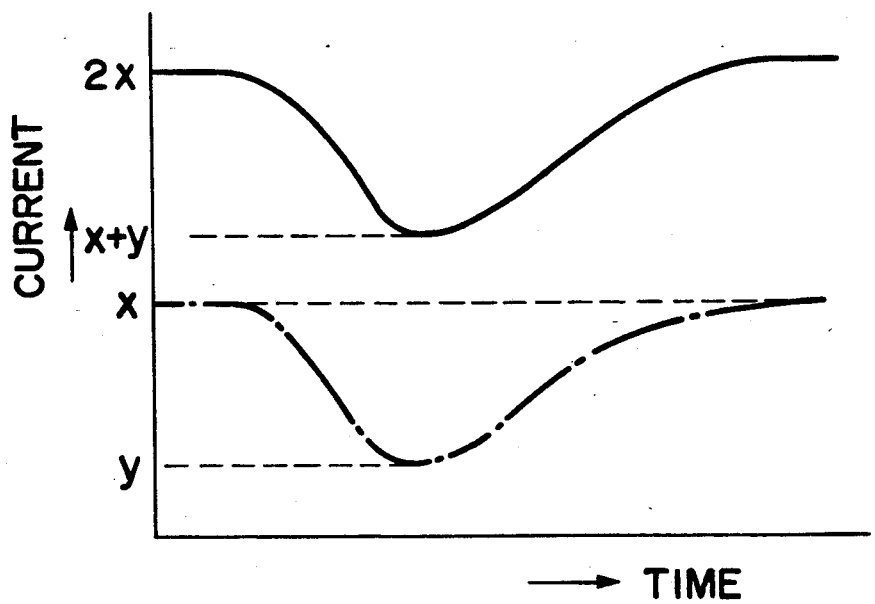
F I G. 8B

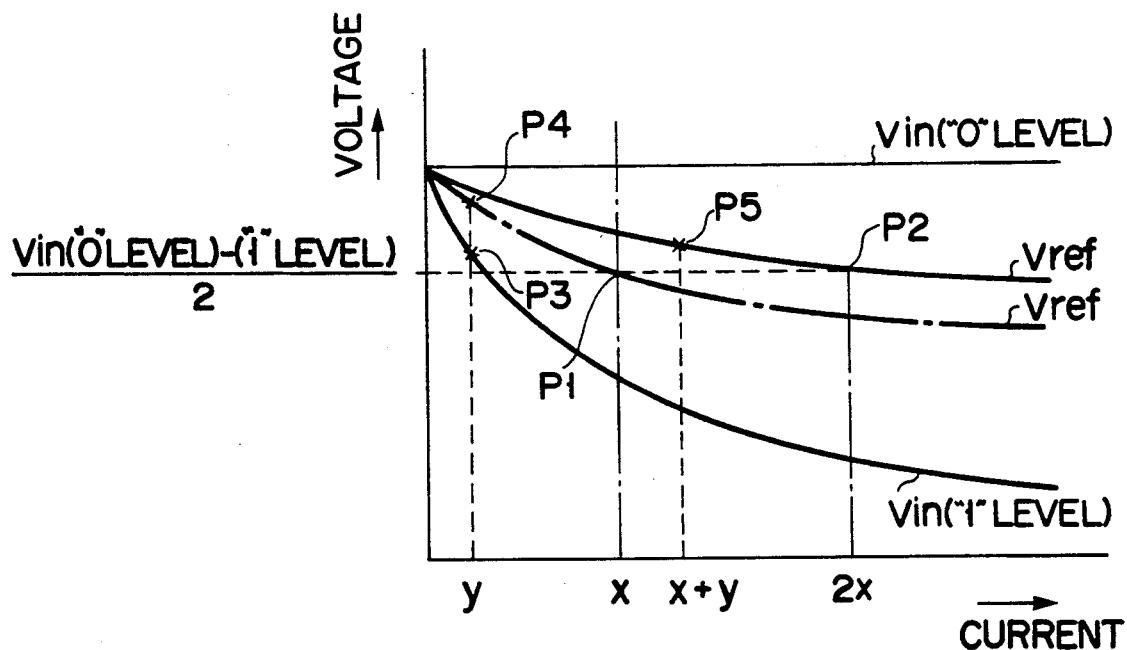
F I G. 9
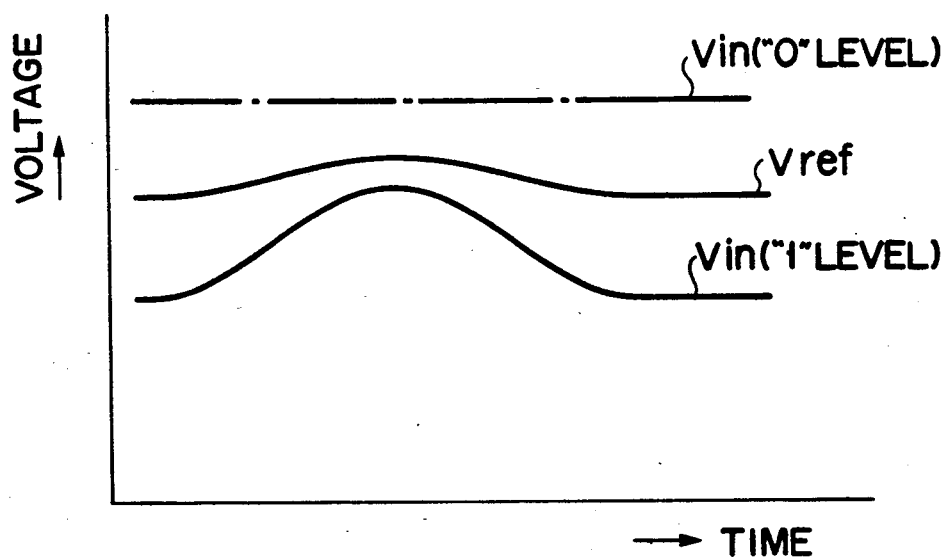
F I G. 10

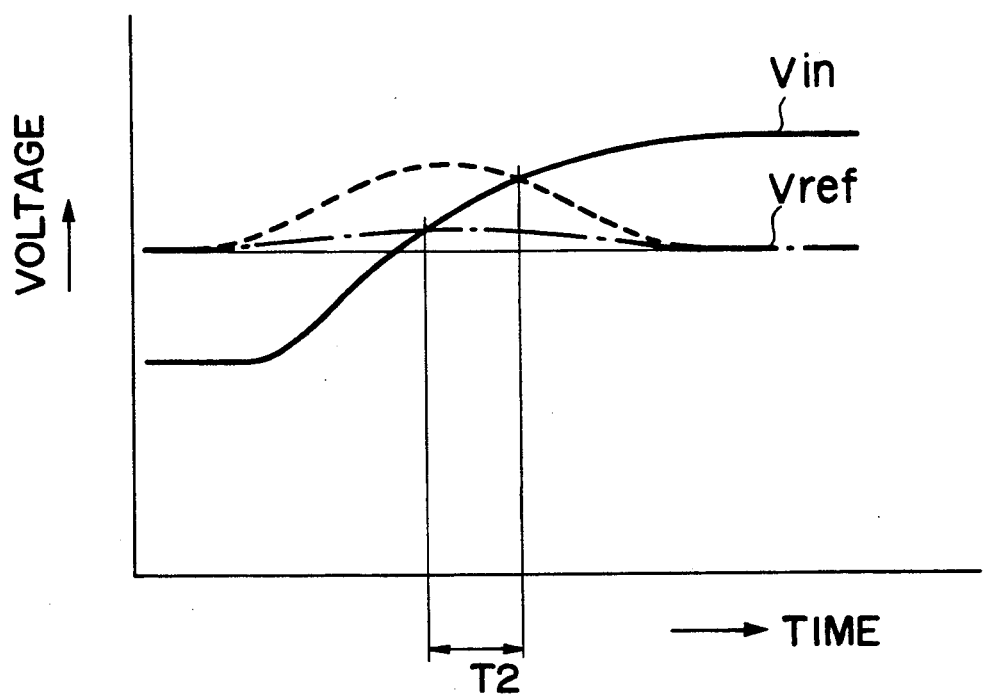
F I G. 11
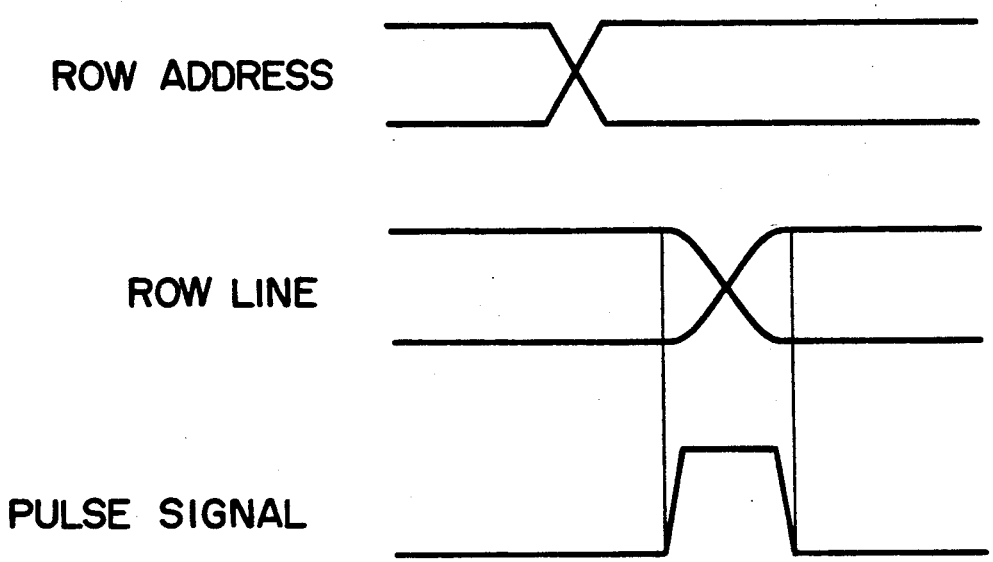
F I G. 14

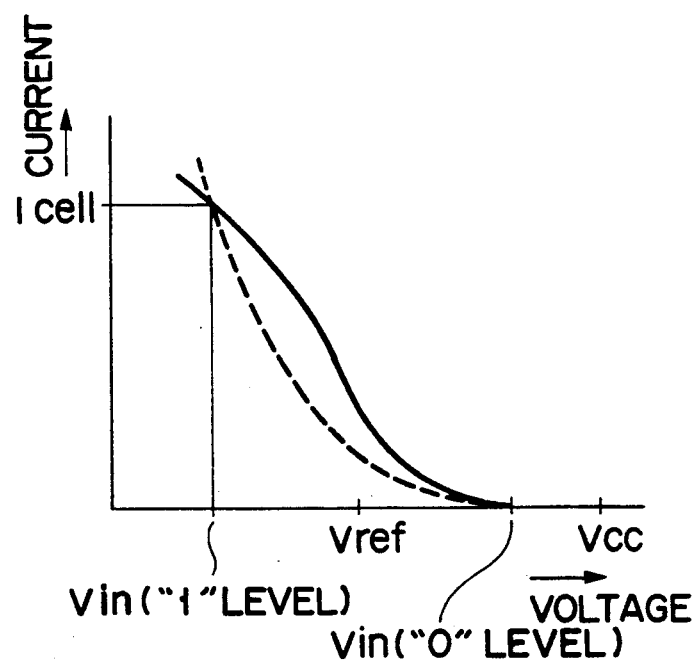
F I G. 16
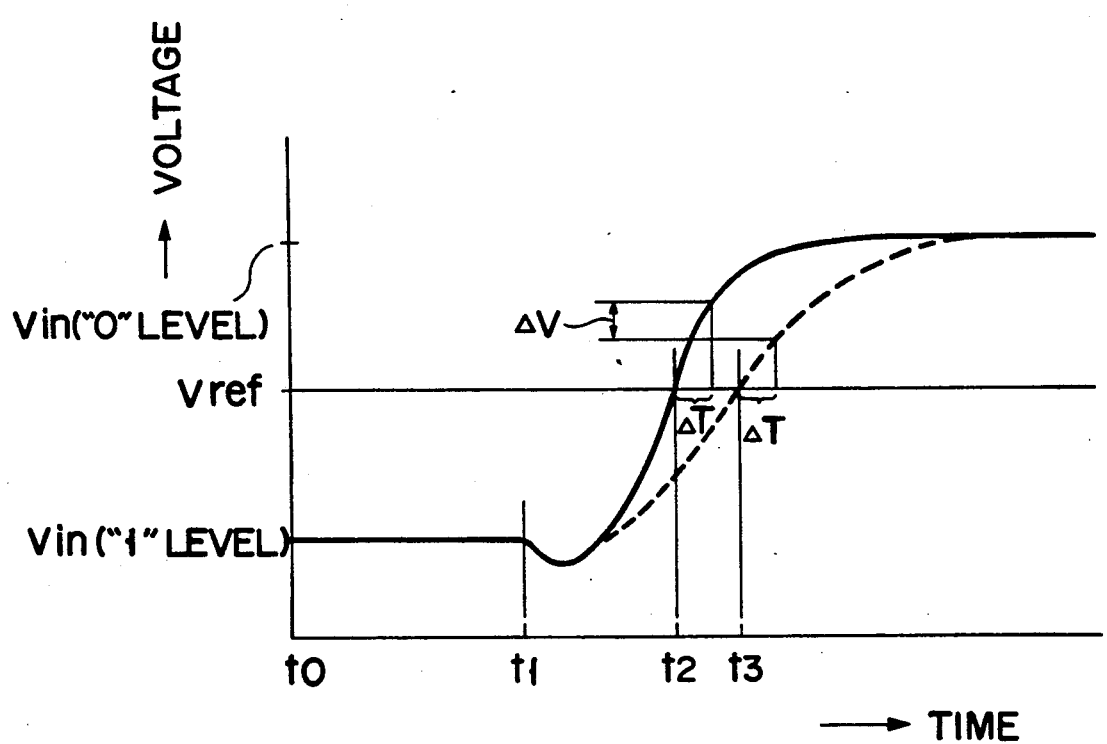
F I G. 17

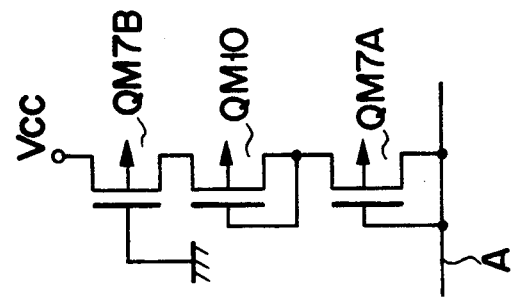
F I G. 19C
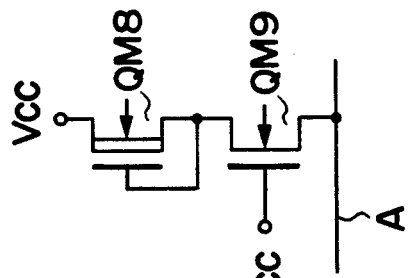
F I G. 19B
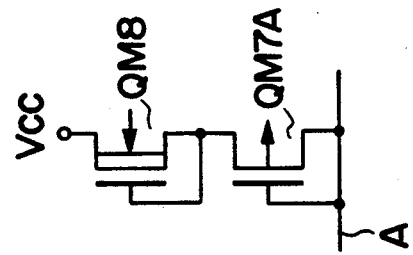
F I G. 19A

SEMICONDUCTOR MEMORY DEVICE WITH ADDRESS TRANSITION ACTUATED DUMMY CELL

This is a continuation of application Ser. No. 07/370,869 filed June 23, 1989, now U.S. Pat. No. 5,040,148 whose contents are herein incorporated by reference.

BACKGROUND OF THE INVENTION

1. Field of the Invention

The present invention relates to a semiconductor memory device improved in a reference potential generating circuit for a sense amplifier and load circuits for memory cells.

2. Description of the Related Art

A conventional semiconductor memory device shown in FIG. 1 is an erasable and programmable ROM (EPROM using floating gate MOSFETs as memory cells.

In the figure, MC11, MC12, . . ., MC1n designate floating gate MOSFETs; DC a floating gate MOSFET as a dummy cell; WL1, wL2, . . ., WLm row lines; BL1, BL2, . . . BLn column lines; DBL a dummy column line; 11 a row decoder; 12 a column decoder; BT1, BT2, . . ., BTn column gate MOSFETs for column selection; DBT a MOSFET that is equivalent to the column gate MOSFET and is normally in a conductive state with application of a power voltage Vcc to the gate of the MOSFET; 13A a first bias setting circuit made up of n-channel MOSFETs QM1 to QM6; 14A a first load circuit made up of a p-channel MOSFET QM7; 13B a second bias setting circuit made up of n-channel MOSFETs QD1 to QD6; 14B a second load circuit made up of a p-channel MOSFET QM7; 15 a sense amplifier; and 16 an output buffer.

In the description to follow, MOSFETs whose channels are not specified will be treated as n-channel MOSFETs.

The dummy cell DC consists of a MOSFET equivalent to that of a memory cell MC that is any of the memory cells MC11 to MCmn. The dummy column line DBL is equivalent to the column line BL that is any of those column lines BL1 to BLn.

A potential V1 at the output node of a low potential generating circuit formed of MOSFETs QM2 and QM3, which is lower than the power voltage Vcc, is applied to the gate of a MOSFET QM1 in the first bias setting circuit 13A. A potential V2 at the output node of a low potential generating circuit formed of MOSFETs QM5 and QM6, which is lower than the node potential V1, is applied to the gate of a MOSFET QM4. The node potential V2 is set at a voltage which is the sum of a potential on the column line BL when a predetermined current flows into the memory cell MC, and a threshold voltage of the n-channel MOSFET containing an increased threshold voltage due to the substrate bias effect. The MOSFET QM4 is an initial charging MOSFET for quickening an initial charging to the column line BL in which the column line BL is charged from an initial voltage 0 v. The initial charging MOSFET is rendered nonconductive when the column line potential exceeds a potential on the column line when a predetermined current flows into the memory cell MC.

In the EPROM thus arranged, a reference potential Vref is generated by the second load circuit 14B on the basis of the data in the dummy cell DC, and appears at a node B. An input potential Vin is generated by the first load circuit 14A on the basis of the data read out of a memory cell MC as selected by the output signals of the row decoder 11 and the column decoder 12, and appears at a node A. The sense amplifier 15 compares the reference potential Vref and the input potential Vin to sense a type of the data stored in the memory cell MC. The sensed data is amplified by the sense amplifier 15, and outputted through the output buffer 16.

In each memory cell of the EPROM, data is programmed by selectively injecting electrons into the floating gate of the cell. For injecting electrons into the floating gate, a high voltage, e.g., 12.5 to 21 V, which is much higher than the normal power voltage, e.g., 5 v, is applied to the column line and row lines as are selected by the row decoder 11 and the column decoder 12. Under such a high voltage, an impact ionization occurs in the vicinity of the drain of the memory cell located at a cross point of the selected row and column lines, to generate electron-hole pairs. Of the generated electron-hole pairs, the electrons are injected into the floating gate of the memory cell. A threshold voltage of the memory cell injected with electrons is much higher than that of the memory cell not injected. The memory cell whose floating gate is injected with electrons maintains an off-state even if a signal of "1" level (power voltage Vcc) is supplied to the control gate of the cell, or the row line. Under the same condition, the memory cell not injected with electrons is turned on. Since the dummy cell DC is not injected with electrons, no potential difference is caused between the potentials Vref and Vin.

To avoid this, a channel width WD7 of the MOSFET QD7 in the second load circuit 14B is set to be larger than that WM7 of the MOSFET QM7 in the first load circuit 14A. With such a channel width selection, a conduction resistance of the MOSFET QD7 is smaller than that of the MOSFET QM7. To be more specific, the conduction resistance of the MOSFET QD7 is so selected that the reference potential Vref is between the Vin potential when the electron injected memory cell is selected and the Vin potential when the non electron injected memory cell is selected. With such an arrangement, even when the non electron injected memory cell is selected, a preset potential difference is caused between the potentials Vref and Vin. When the selected memory cell is an electron injected one, the potential Vin represents a potential which is the result of a subtraction of the threshold voltage of the load MOSFET QM7 from the power source voltage Vcc.

In the subsequent description, the electron injected memory cell or the memory cell with a high threshold level will be assumed to be a memory cell storing "0" data. The non electron injected memory cell or the memory cell with a low threshold voltage will be assumed to be a memory cell storing "1" data.

In the above EPROM, the data read out by the sense amplifier is received by the buffer 16, and the buffer 16 outputs the data. In the output buffer 16, it is necessary to charge and discharge an external large load capacitor. Therefore, when the output buffer 16 produces the data, noise is generated in the power source. The noise causes a variation in the power source voltage Vcc. As recalled, the conduction resistance of the MOSFET QD7 in the second load circuit 14B is different from that of the MOSFET QM7 in the first load circuit 14A. Therefore, these transistors respond to the power voltage variation in a different way. In an extreme case, a proper amplitude relationship between the potentials Vin and Vref is reversed, so that the sense amplifier may produce erroneous data. Such a malfunction of the sense amplifier should be avoided.

The EPROM of FIG. 1 will encounter a situation that a row line connected to the memory cells of "1" data that is currently selected is switched to another row line connected to the memory cell having the same data, and subsequently the data are successively read out from the memory cells on the new row.

In such a situation, the memory cells selected anew are insufficiently turned on in the initial stage, until the potential of the row line selected anew reaches power source voltage Vcc. Consequently, the potential of the selected bit line is temporarily increased. The threshold voltage of the memory cell of the floating gate structure is approximately 2 V. During the transient period of time that the row lines are switched one from the other, the memory cells connected to the selected column line are instantaneously in an off-state. Because of this, at the time of switching the row lines, there occurs a charging operation for the column line, and the potential Vin of the node A temporarily rises, as shown in FIG. 2.

Meanwhile, since the dummy cell DC is placed always in an on state by the power voltage Vcc, the reference potential Vref is always constant as shown in FIG. 2 showing waveforms of potentials Vref and Vin. When the potential Vin rises and crosses a line of the reference potential Vref as shown, the sense amplifier 15 temporarily produces the data of an improper logic level. As a result, the output data of the buffer 16 varies its logic level, "1"→"0"→"1", during a short period. Therefore, an inductance component existing in the lead creates a great variation of the earth voltage, possibly causing a malfunction of a circuit in the EPROM.

To prevent the malfunction of the circuit due to a variation of the earth voltage, there has been proposed an EPROM as shown in FIG. 3.

In this EPROM, the dummy cells DC1 to DCm are provided corresponding to row lines WL1 to WLm, respectively. The control gates of the dummy cells DC1 to DCm are connected to the row lines WL1 to WLm, respectively. And, the drains of the dummy cells DC1 to DCm are connected to a dummy column line DBL.

In the arrangement of the EPROM, the dummy cells are controlled by the signals on the row lines. Even in the situation that the row lines are switched from one to the other, and succeeding to the memory cell storing data "1" on the previous or old row line, the memory cell storing the data "1" on the present or new row line are subjected to the read operation, the dummy column line DBL is charged by the load circuit 14B at the time of switching the row lines. Accordingly, as seen from FIG. 4 showing waveforms, the reference potential Vref rises as the potential Vin ("1" level) rises. In the EPROM, the potential Vin does not cross the curve of the reference potential Vref. The output data of the output buffer 16 is invariable, and no variation of the earth voltage is caused.

The rise of the potentials Vin and Vref is caused by the charging operation at the time of switching of the row lines, and hence the degree of the potential rise is different depending on the conduction resistances of the MOSFETs QM7 and QD7 in the load circuits 14A and 14B. As described above, the conduction resistance of the MOSFET QD7 is set much smaller than that of MOSFET QM7. Because of this, the reference potential Vref rises to a level (denoted by Vref in FIG. 5) much higher than a level (denoted by a broken line in FIG. 5) in which the reference potential Vref in the FIG. 1 circuit is. Therefore, the reading speed for "0" data of the circuit shown in FIG. 3 is lower by time T (FIG. 5) than that of the circuit shown in FIG. 1.

As described above, in a conventional semiconductor memory device, when the row lines are switched under the condition that a memory cell storing "1" data is selected to select a memory cell storing "1" data, error data is outputted, and a noise occurs in the power source to consequently cause a malfunction of the semiconductor memory device.

In another conventional semiconductor memory device solving the above problem, a variation of the reference potential is greater than that of the input potential. Therefore, the data reading speed when the selected row line is switched becomes slow.

A characteristic curve depicted by a solid line in FIG. 6 shows a voltage vs. current characteristic curve of the first load circuit 14 in the conventional semiconductor memory device. In the figure the abscissa represents a potential Vin at the node A and the ordinates a load current flowing into the load circuit. It is assumed that Vin ("1" level) is a potential at the node A caused when the memory cell of a low threshold voltage is selected and a memory cell current Icell flows, and Vin ("0" level) is a potential at the node A and Vref is a potential at the node B.

It has been known that the time required for the row line selection and the time required for the charging or discharging of the junction capacitance connected to the row line greatly determine a data read speed of a nonvolatile semiconductor memory device of the structure shown in FIG. 1. A signal delay time in the row line depends largely on a resistance of the material of the row line. For this reason, tungsten silicide has recently superseded polysilicon used conventionally. The resistance of tungsten silicide is smaller than that of polysilicon. As a result, the data read speed depends largely on the charging and discharging speed of the junction capacitance connected to the column line. Particularly, when the column line is switched one from the other, and the memory cell of a high threshold voltage is selected, the charging to the new selected column line starts at the voltage of 0 V. Accordingly, capacitance connected to the column lines has become large, with the increase of the semiconductor memory capacity. Accordingly, to realize a high speed read operation, it is necessary to quicken both the charging speed of the column line and the read operation for reading out the "0" data. In conventional measures taken for this, the column line is charged at a high speed through the initial charging transistor QM4 when the potential is less than Vin ("1" level). When the potential of the column line BL exceeds Vin ("1" level), the transistor QM4 becomes nonconductive. At this time, only the p-channel transistor QM7 in the load circuit 14A charges the column line BL. Since the gate of the p-channel transistor QM7 is connected to the drain thereof, when the potential Vin at the node A rises, a conduction resistance of this transistor QM7 rapidly increases, and a charge current rapidly decreases. Therefore, it takes much time for the potential at the node A to rise from Vin ("1" level) to Vin ("0" level), lowering the data read speed. In other words, the time taken for the node A potential to rise from Vin ("1" level) to Vin ("0" level) can be reduced by increasing the the channel width of the transistor QM7 and reducing its conduction resistance. However, the decrease of the conduction resistance of the transistor QM7 creates another problem that a margin for the power source noise is narrowed.

In FIG. 6, a characteristic curve as indicated by a dotted line is obtained for the transistor QM7 whose conduction resistance is $\frac{1}{2}$ that of the same transistor when the cell current vs. input voltage Vin characteristic thereof is indicated by a solid line. When the $\frac{1}{2}$ conduction resistance of the transistor QM7 is set, the potential Vin at the node A when the memory cell storing the "1" data, viz., the memory cell of a low threshold voltage, is selected, is Vin ("1" level)' The potential Vref at the node B is set at exactly the middle point between the potential Vin ("I" level)' at the node A when the memory cell of "1" data is selected and that Vin ("0" level) when the memory cell storing "0" data, i.e., the memory cell of a low threshold voltage. Accordingly, the conduction resistance of the p-channel MOS transistor QD7 in the second load circuit 14B is so selected that the potential at node B when the $\frac{1}{2}$ conduction resistance of transistor QM7 is set is equal to --Vref-- as {Vin ("0" level)−Vin ("1" level)]}/2. As a result, when the data of "1" or "0" is selected, a difference between the potential at the node B and that at the node A is reduced by {Vin ("1" level)' −Vin ("1" level)}/2. Generally, the ground potential greatly varies when the data is outputted from the output buffer. At this time, the potentials at the nodes A and B also vary due to the ground potential variation. In the first and second load circuits 14A and 14B, the conduction resistances of the transistors QM7 and QD7 are different from each other. The variation in the potentials at the nodes A and B are different. Accordingly, a small difference of the potential between the nodes A and B causes a malfunction of the circuit.

As described above, the conventional semiconductor memory device improved in the read speed by using a small conduction resistance in the load circuit, is apt to malfunction due to the power noise.

SUMMARY OF THE INVENTION

Accordingly, an object of the present invention is to provide a semiconductor memory device which is free from the power noise even during a transient period that row lines are switched from one to the other, and is operable at an increased data read speed.

According to an aspect of the present invention that is directed to achieve the above object, there is provided a semiconductor memory device comprising: row lines; memory cells selected by the row lines; column lines receiving data from the memory cells; a first load circuit coupled with the column lines; first dummy cells whose control gates are connected to the row lines; a dummy column line to which the first dummy cells are connected; a second load circuit connected to the dummy column line; a second dummy cell connected to the dummy column line and supplied at the gate with a preset potential; and a sense amplifier for sensing the data stored in the memory cell in accordance with a potential difference between the column line and the dummy column line.

According to another aspect of the present invention, there is provided a semiconductor memory device comprising: row lines; memory cells selected by the row lines; column lines receiving data from the memory cells; a first load circuit coupled with the column lines; first dummy cells selected by the row lines; a dummy column line to which the first dummy cells are connected; a second load circuit connected to the dummy column line; a pulse signal generating circuit for generating a pulse signal by detecting a change in an address input signal; a second dummy cell connected to the dummy column line and controlled in conduction by a pulse signal generated by the pulse signal generating circuit; and a sense amplifier for sensing the data stored in the memory cell in accordance with a potential difference between the column line and the dummy column line.

According to a further object of the present invention, there is provided a semiconductor memory device comprising: row lines; memory cells selected by the row lines; column lines receiving data from the memory cells; a first load circuit coupled with the column lines; first dummy cells selected by the row lines; a dummy column line to which the first dummy cells are connected; a pulse signal generating circuit for generating a pulse signal by detecting a change in an address input signal; a second load circuit connected to the dummy column line, a conduction resistance of the second load circuit to the dummy column line being controlled by a pulse signal generated by the pulse signal generating circuit; and a sense amplifier for sensing the data stored in the memory cell in accordance with a potential difference between the column line and the dummy column line.

In semiconductor memory devices thus arranged, the second dummy cell, which is set in an on state normally or during a transient period of switching row lines from one to the other, is connected to the dummy column line. The connection of the second dummy cell with the dummy line changes a current flowing to the dummy line at the time of row line switching, thereby to hold back a rise of the reference potential at the time of the row line switching.

A conduction resistance of the second load circuit is changed during a transient period of the row line switching, thereby to hold back a rise of the reference potential at the time of the row line switching.

According to another object of the present invention, there is provided a semiconductor memory device which has a large operation margin against a variation of a power voltage due to power source noise, and can easily realize a high operation speed.

To achieve the above objects, there is provided a semiconductor memory device comprising: at least one memory cell; a first MOS transistor connected at one end of the source-drain current path to the drain of the memory cell and at the other end of the source-drain current path to a data sensing node, and the first MOS transistor receiving at the gate a first bias voltage; a load circuit including a first load means and a second load means that are connected in series, the first load means being inserted between the data sensing node and a first power source, when the memory cell is conductive, the first load means operating as a current limiting load, the second load means lowering a potential at the data sensing node below a potential of the first power source when the memory cell is nonconductive, in the load circuit, a conduction resistance of the first load means being larger than a conduction resistance of the second load means; and a sense circuit for reading out the data from the memory cell.

With such an arrangement, when the memory cell is conductive to allow a predetermined current to flow therethrough, the amount of the current flowing through the lead circuit is determined mainly by the first load means in the load circuit. In other words, a conduction resistance in the load circuit is determined mainly by a conduction resistance in the first load means.

When the memory cell is nonconductive, a potential at the data sensing node rises. When the potential reaches a predetermined value, the second load means in the load circuit becomes nonconductive, and a potential at the data sensing node decreases by a predetermined potential from the power source voltage.

BRIEF DESCRIPTION OF THE DRAWINGS

FIGS. 8A and 8B, 9 to 11 are graphs showing operation characteristics of the semiconductor memory device of FIG. 7;

FIG. 14 shows a set of waveforms of signals in an address transition detector used in each of the embodiments of FIGS. 12 and 13;

FIGS. 16 and 17 are graphs showing operation characteristics of the memory device of FIG. 15;

FIGS. 19A through 19C are circuit diagrams of other circuit arrangements of a load circuit used in the memory devices shown in FIGS. 15 and 18.

DETAILED DESCRIPTION OF THE PREFERRED EMBODIMENTS

Some specific embodiments of a semiconductor device according to the present invention will be described with reference to the accompanying drawings.

Figure 7:
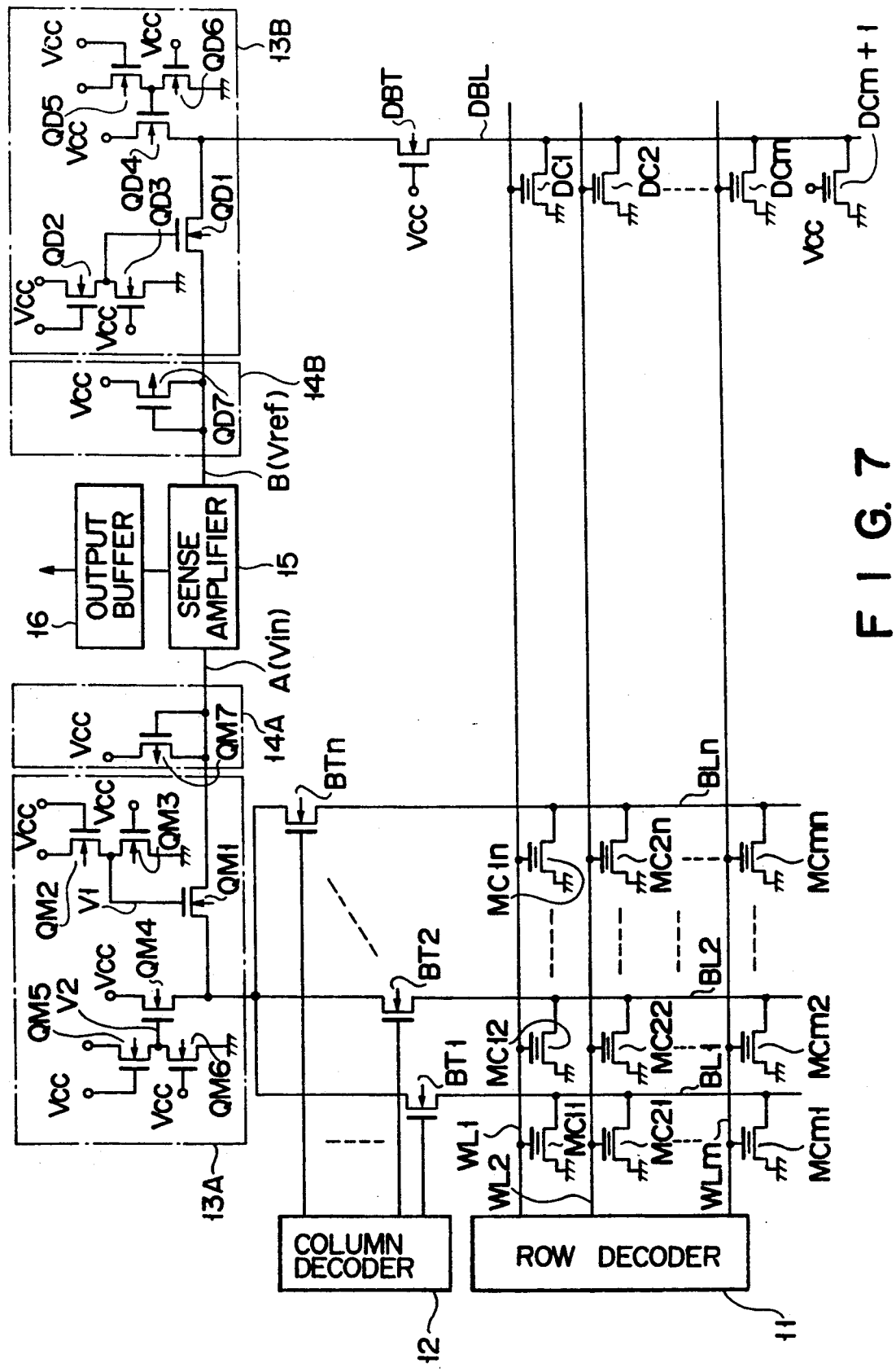
FIG. 7 is a circuit diagram of a semiconductor memory device according to an embodiment of the present invention.

Referring now to FIG. 7, there is shown a circuit diagram of a circuit arrangement for data-sensing of an EPROM using floating gate MOSFETs as already mentioned in the prior art description, to which a semiconductor memory device according to the present invention is applied.

In FIG. 7, MC11, MC12, ..., MC1n, ..., MCmn designate floating gate MOSFETs; DC1, DC2, ..., DCm dummy cells (first dummy cells) as floating gate MOSFETs; WL1, WL2, ..., WLn row lines; BL1, BL2, ..., BLn column lines; DBL a dummy column line; 11 a row decoder; 12 a column decoder; BT1, BT2, ..., BTn column gate MOSFETs for column selection; DBT a MOSFET that is equivalent to the column gate MOSFET and is normally in a conductive state with application of a power voltage Vcc to the gate of the MOSFET; 13A a first bias setting circuit made up of n-channel MOSFETs QM1 to QM6; 14A a first load circuit made up of a p-channel MOSFET QM7; 13B a second bias setting circuit made up of n-channel MOSFETs QD1 to QD6; 14B a second load circuit made up of a p-channel MOSFET QD7; 15 a sense amplifier; and 16 an output buffer.

In the description to follow, MOSFETs whose channels are not specified will be treated as n-channel MOSFETs. The dummy cell DC that is any one of the dummy cells DCl to DCm comprises a MOSFET equivalent to that of a memory cell MC that is any one of the memory cells MC11 to MCmn. The dummy cell DCm+1 also comprises a MOSFET equivalent to that of the memory cell MC.

In the dummy cells DC1, DC2, ..., DCm, the drains of them are connected together to the dummy column line DBL. The control gates of them are connected to the row lines WL1 to WLm, respectively. The sources of those transistors are grounded. The drain of the dummy cell DCm+1 is connected to the dummy column line DBL. A power voltage Vcc is always supplied to the control gate of the dummy cell DCm+1. The source thereof is grounded.

The first and second bias potential setting circuit 13A and 13B are constructed like those in the conventional semiconductor memory device.

For example, in the first bias potential setting circuit 13A, the source-drain current path of the MOSFET QM1 is inserted between a connection point of the column gate MOSFETs BT1 to BTn and the node A. The gate of the MOSFET QM1 is applied with a DC bias potential v1 which is lower than the power voltage Vcc and formed by the two MOSFETs QM2 and QM3. The source-drain current path of the MOSFET QM4 is inserted between a connection point of the column gate MOSFETs BT1 to BTn and the power voltage Vcc. The gate of the MOSFET QM4 is applied with a DC bias potential V2 which is lower than the DC bias potential V1 and formed by the two MOSFETs QM5 and QM6. The DC bias potential V2 is set at a value which is the sum of a column line potential when a memory cell whose threshold voltage is set at a low voltage is selected and a predetermined current flows through the source-drain current path of the memory cell, and a threshold voltage of the n-channel MOSFET containing an increased threshold voltage due to a substrate bias effect.

The circuit arrangement of the second bias potential setting circuit 13B is substantially the same as that of the first bias potential setting circuit when the MOSFETs QD1 to QD6 are replaced by the MOSFETs QM1 to QM6.

The first and second load circuits 14A and 14B are also substantially the same as those in the conventional memory device.

Specifically, in the first load circuit 14A, the source-drain current path of MOSFET QM7 is inserted between the node A and the power source Vcc. The gate of the MOSFET QM7 is connected to its drain and the node A. The MOSFET QM4 in the first bias potential setting circuit 13A is for the initial charging of the column line. When a column line BL is selected and a charging for the column line BL starts from an initial value 0 V, the transistor QM4 quickens the initial charging. The DC bias voltage V2 is set such that the MOSFET QM4 is turned off when the column line potential exceeds a column potential when a predetermined current flows into the memory cell.

The circuit arrangement of the second load circuit 14B is substantially the same as that in the conventional memory device. However, the conduction resistance is set larger than that in the conventional device. The dummy column line DBL is connected to the dummy cell DCm+1, which constantly receives at the gate the power voltage Vcc, and normally in an on state. And, the dummy column line DBL is discharged through the dummy cell DCm+1 and a dummy cell DC (indicates any one of the dummy cells DC1 to DCm) connected to the selected row line WL. Accordingly, to maintain the reference potential Vref at the mid potential between "1" and "0" level of the input potential Vin, the conduction resistance of the load MOSFET QD7 in the second load circuit 14B is set to be approximately two times that of the MOSFET QD7 in the conventional memory device shown in FIG. 1.

The operation of the semiconductor memory device thus arranged will now be described.

In the operation, memory cells storing "1" data that are selected by switching one row line to other row line are successively subjected to a data read operation. When the row lines are switched, as shown in FIG. 8A showing waveforms, a potential of the nonselected row line WLi (i=1, 2, ..., m) drops from "1" to "0" in level. A potential of the selected row line WLj (j=2, ..., m) rises from a "0" level to "1". The current flowing through the dummy cell at the time of this row line switching, is shown by a curve of a solid line in FIG. 8B. In the figure, the value "x" of the current equals to the current flowing through the selected dummy cell DC when the potential of the selected row line is the power source voltage Vcc. In this embodiment, the dummy cell is formed of a floating gate type MOS transistor which is the same in structure, channel width, and channel length as that of the memory cell in the memory matrix. Also in this embodiment, the current flowing through the memory cell whose control gate is continuously supplied with the power source Vcc equals to the value "x". Consequently, the current flowing through the dummy cell DCm+1 also becomes the value "x" and thus, the current flowing through the dummy cell before the row lines are switched becomes "2x".

The minimum value of the current flowing through the selected dummy cell DC at the row line switching is denoted by "y" in FIG. 8B. Therefore, the minimum value of the current flowing through all the dummy cells at the row line switching is "x+y". In FIG. 8B, a one-dot-chain line indicates a variation of the sum of the currents flowing through all the dummy cells, which equals to the sum of currents flowing in the conventional memory device shown in FIG. 1.

FIG. 9 shows a variation of the reference potential Vref (indicated by a solid line) against the sum of the currents flowing through all the dummy cells, which is prepared on the basis of the FIG. 8 data. In addition to the reference potential Vref, the illustration of FIG. 9 contains potential variations of an input potential Vin ("1" level) when the data is read out from the memory cell storing "1" data against the sum of the currents flowing through all the dummy cells, an input potential Vin ("0" level) when the data is read out from the memory cell storing "0" data, and a reference potential Vref in the conventional memory device of FIG. 1 (indicated by a one-dot-chain line) against the current flowing through the dummy cell. The input potential Vin ("0" level) is constant since no current flows through the dummy cells when "0" data is read out.

In the present embodiment, the dummy column line DBL is connected to the dummy cell DC driven by the selected row line and the dummy cell DCm+1 driven by power source Vcc. Because of this, the conduction resistance of the MOSFET QD7 in the second load circuit 14B is selected such that when a double cell current flows, the same reference potential as that of the conventional memory device can be obtained.

Figure 1:
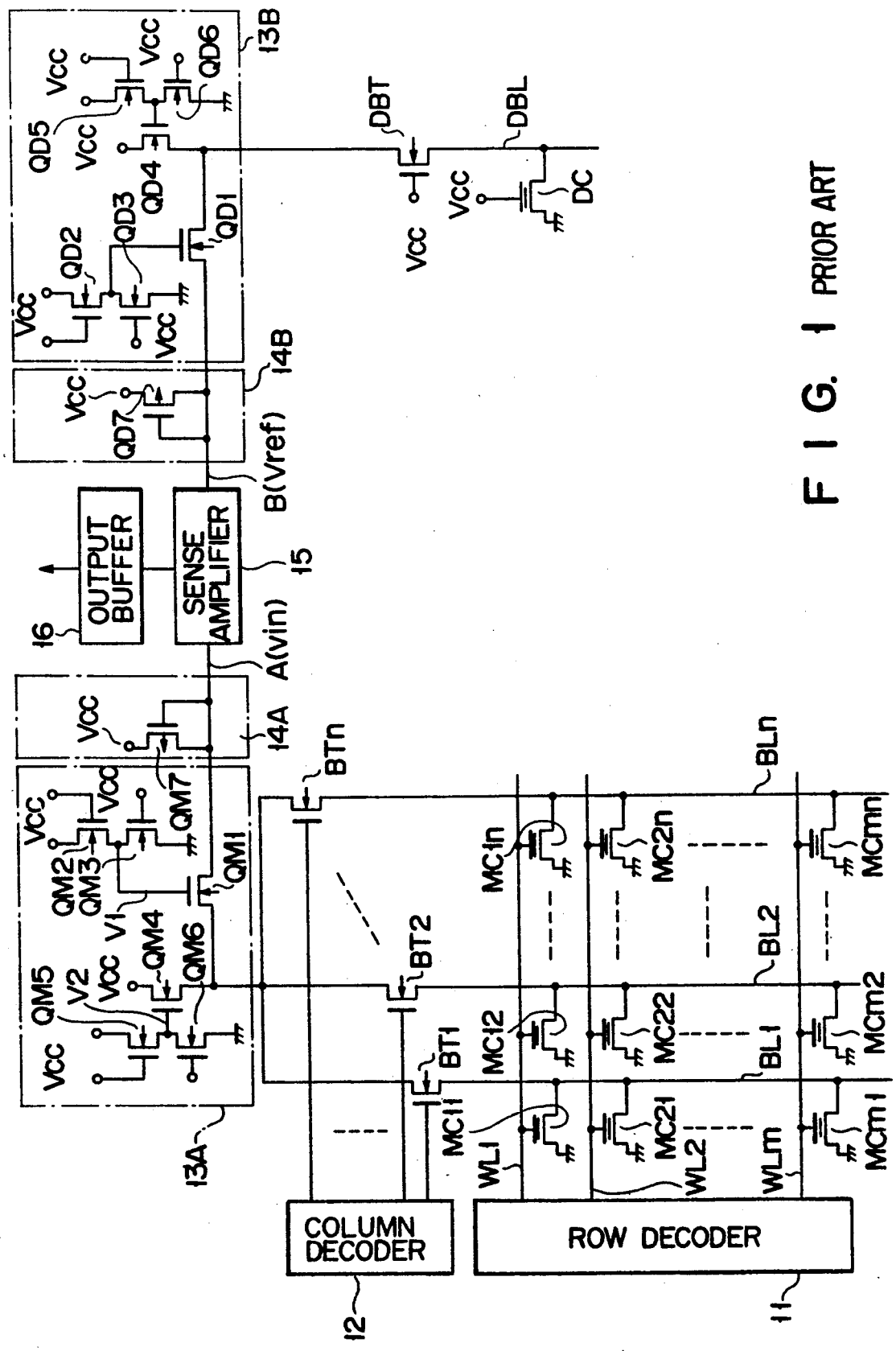
FIG. 1 is a circuit diagram of a conventional semiconductor memory device.
Figure 2:
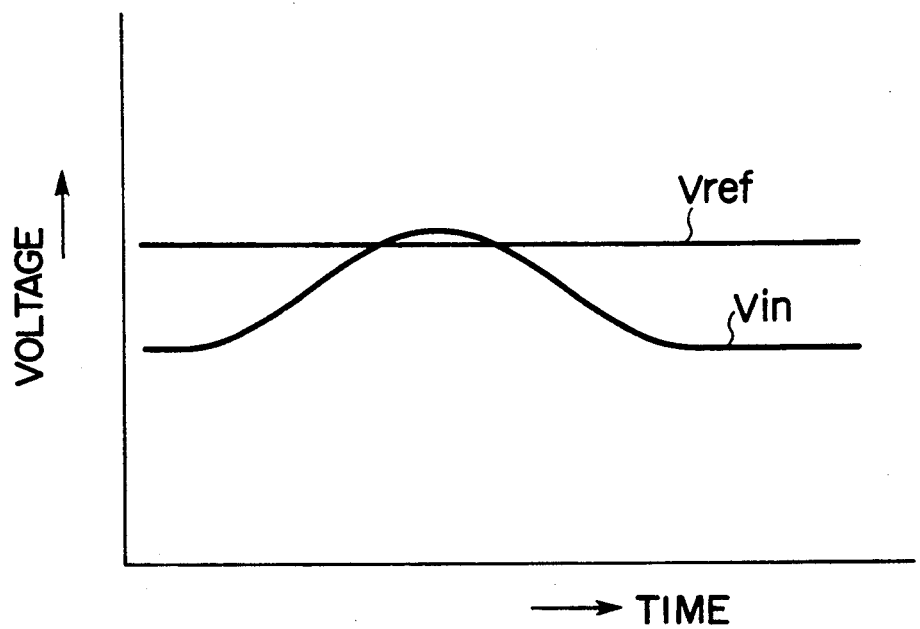
FIG. 2 shows a graphical representation of transient voltage waveforms at the nodes A and B in the memory device shown in FIG. 1.

As seen from the graph, the reference potential Vref of the conventional memory device of FIG. 1 reaches {(Vin ("0" level)−Vi ("1" level)}/2 at point P1 where the current flowing through the dummy cell is "x". In the memory device of the present embodiment, the conduction resistance of MOSFET QD7 is set such that the reference potential Vref reaches {(Vin ("0" level)−Vin ("1" level)}/2 at point P2 where the current is 2x.

In the memory device under discussion having such a Vref variation, the current flowing through the dummy cell becomes minimum (a point where the current is "y") at the time of the row line switching. When the potential Vin ("1" level) rises to the potential at point P3, the reference potential Vref rises to the potential at point P4 in the conventional memory device of FIG. 1. On the other hand, in the semiconductor device according to the present invention, the reference potential Vref rises to reach just the potential at point P5, since the current flowing through the dummy cells is "x+y".

Figure 4:
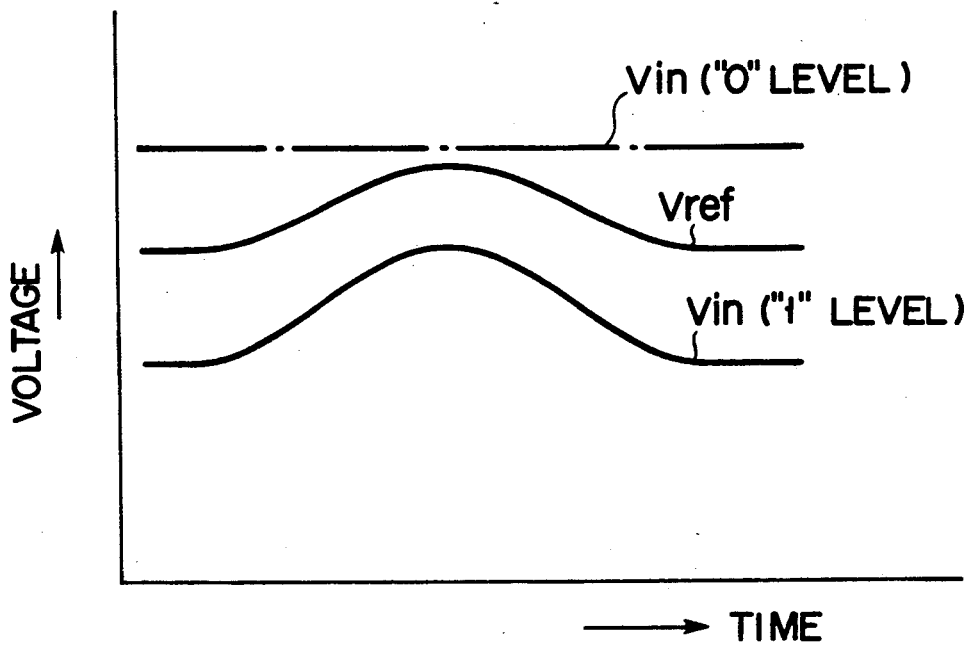
FIGS. 4 and 5 show graphical representations of transient voltage waveforms at the nodes A and B in the memory device shown in FIG. 3.
Figure 3:
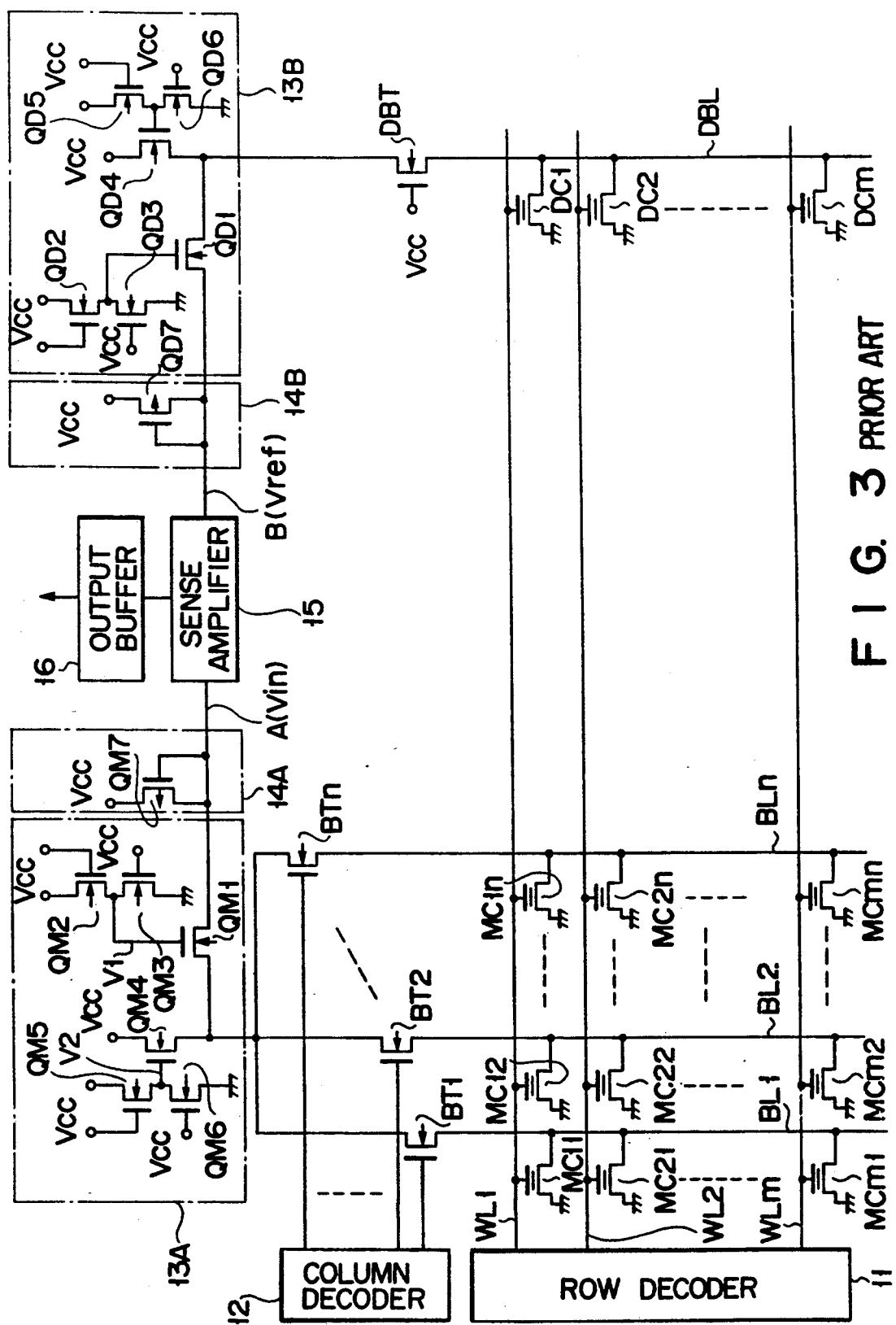
FIG. 3 is a circuit diagram of another conventional semiconductor memory device.
Figure 5:
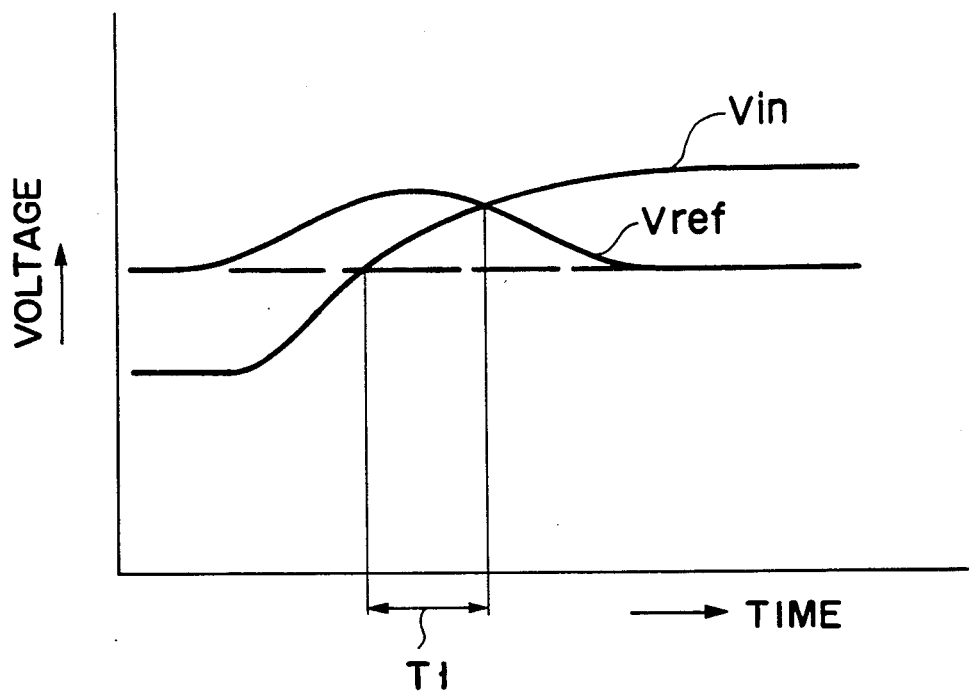
Figure 6:
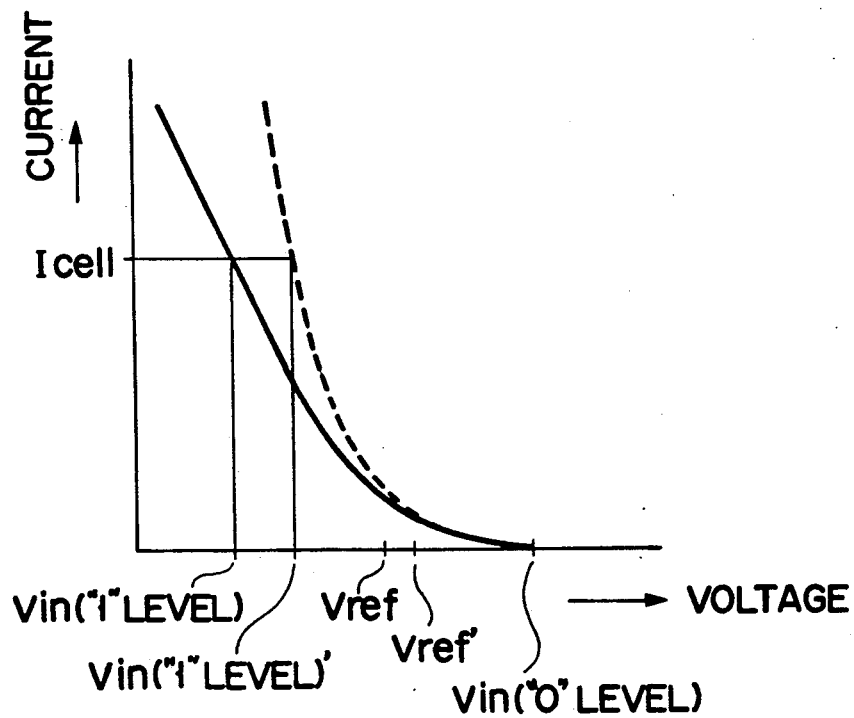
FIG. 6 shows a graphical representation of a load current vs. sensing node voltage characteristic of a first load circuit in the conventional memory device.

Turning now to FIG. 10, there are shown variations of the reference potentials Vref and the input potential Vin when the row lines are switched and the memory cells storing "1" data on the new row line are subjected to the data read operation, subsequent to the memory cells on the previous row line. As seen from the graph, when the current flowing through the dummy cell becomes minimum at the time of the row line switching, the degree of the increase of a potential level of the reference potential Vref is much lower when compared with the degree of the increase of the reference voltage Vref in the conventional memory device of FIG. 3 (see FIG. 4). Further, the curve of the reference potential Vref never crosses the line of the input potential Vin in the memory device. Therefore, the occurrence of the power source noise due to the operation of the output buffer is prevented.

When the row lines are switched one from the other, and the memory cell from which data is read out is shifted from the "1" memory cell to a "0" memory cell, the reading speed is higher than that of the conventional device by such an amount of time T2 (FIG. 11) that a rising speed of the reference potential (indicated by a one-dot-chain line) in the present embodiment is lower than that of the reference potential (indicated by a broken line) in the conventional semiconductor device. This contributes to improvement of the data read speed.

In the embodiment of FIG. 7, the power voltage Vcc is applied to the gate of the dummy cell DCm+1 for adjusting the reference potential, but it may be any other voltage than the voltage Vcc, provided that it is constant when the row lines are switched. Also in the above embodiment, the dummy cells DC1 to DCm and the dummy cell DCm+1 are connected to the same dummy column line DBL. Two different dummy column lines may be provided and be connected to the dummy cells DC1 to DCm, and the dummy cell DCm+1, respectively. In this case, each dummy column line is coupled with a MOSFET equivalent to the column gate MOSFET, and a load circuit. The load circuits coupled with these dummy column lines produce output signals which are supplied to an input of the sense amplifier 15. The same effects as those in the above embodiment are provided in this modification.

Another embodiment of a semiconductor memory device according to the present invention will be described with reference to FIG. 12. Also in this embodiment, the present invention is applied into an EPROM using floating gate MOSFETs as memory cells. The present embodiment is different from the embodiment of FIG. 7 in the following points. An address transition detector (ATD) 18 is additionally used. An output signal of the ATD 18 is applied to the gate of the dummy cell DCm+1. In the FIG. 7 embodiment, the power voltage Vcc is constantly applied to the same. A row address is applied to the row address buffer 17. When a row address changes and the word lines are switched, the ATD 18 generates a pulse signal of a predetermined pulse width.

Incidentally, reference numeral 19 designates a column address buffer receiving a column address. The output signals of the address buffers 17 and 19 are applied to the row and column decoders 17 and 19, respectively.

In this embodiment, during a transient period that a row address changes and the present row line is switched to another row line, the ATD 18 produces a pulse signal to turn on the dummy cell. In other words, the dummy cell is turned on during the time of the row line switching. Accordingly, at the time of the row line switching, a current flowing into the dummy column line DBL increases, to hold back a rise of the reference potential Vref.

In this embodiment, during the time other than the transient time of the row line switching, the dummy cell DCm+1 is turned off. Accordingly, the conduction resistance of the load MOSFET QD7 in the second load circuit 14B is set at a value comparable to that of the MOSFET QD7 in the conventional semiconductor device.

In each of the above embodiments, at the time of the row line switching, to hold back a rise of the reference potential Vref at the time of the row line switching, the discharge current of the dummy column line DBL is increased. Further, the holding back of the rise of the reference potential Vref may be realized by directly controlling the conduction resistance of the second load circuit 14B, not using the dummy cell DCm+1.

Figure 13:
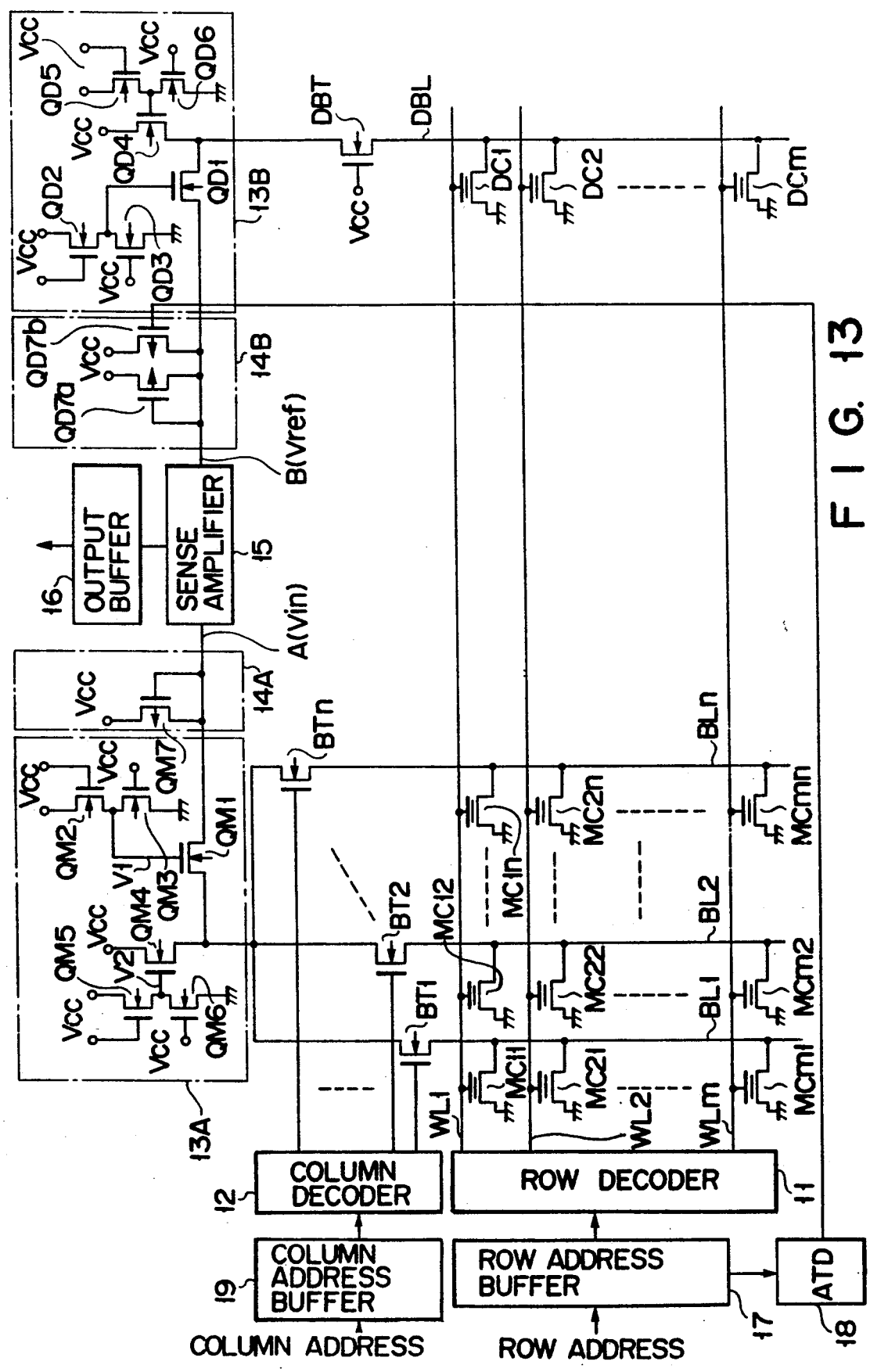

The direct control of the conduction resistance of the second load circuit 14B may be implemented into an arrangement shown in FIG. 13. As shown, a pair of p-channel MOSFETs QD7a and QD7b are connected in parallel between the power voltage Vcc and the node B. The gate of the transistor QD7a is connected to its drain. The transistor QD7b receives at the gate a pulse signal from the ATD 18.

In the semiconductor memory device thus arranged, at the time of the row line switching, the ATD 18 produces an output pulse signal and turns off the MOSFET QD7b by the pulse signal. Accordingly, a current fed to the node B at which the reference potential Vref appears decreases, thereby to hold back the rise of the reference potential Vref. In this embodiment, after the row line switching is completed, the load transistors QD7a and QD7b in the second load circuit 14B are both turned on. Accordingly, the sum of the conduction resistance of these transistors QD7a and QD7b are selected to be substantially equal to that of the transistor QD7 in the memory device of FIG. 3. If necessary, two different bias voltages setting circuits may be provided for the MOSFETs QD7a and QD7b.

Figure 12:
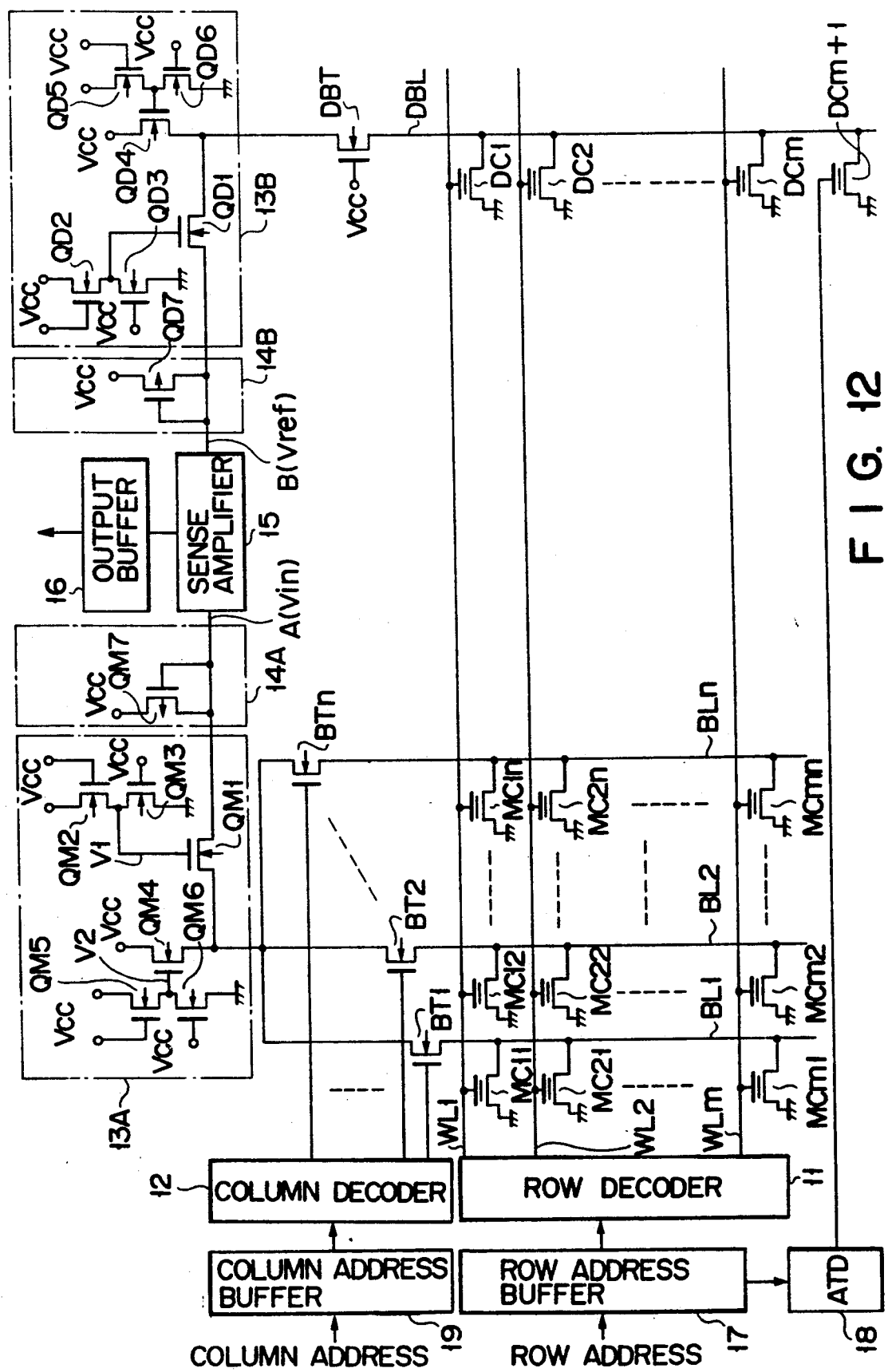
FIGS. 12 and 13 are circuit diagrams of a semiconductor memory device according to other embodiments of the present invention.

FIG. 14 shows a timing chart for explaining the operation of the ATD 18 that is used in the embodiments of FIGS. 12 and 13. As seen from the timing chart, a row address signal externally applied changes, and with the change of the address signal, the row line currently used is switched to a new row line. During this period of the row line switching, the ATD 18 produces a pulse signal which retains a "1" logical state during this period. A circuit having such a function may readily be realized by combining signal delay and logic circuits.

It is evident that the present invention is applicable not only for the EPROM but also for a mask ROM using MOSFETs of a single gate structure as memory cells, whose threshold voltages are adjusted, low and high, by selectively doping impurity into the channel regions of the transistors during the manufacturing process.

The p-channel MOSFET for load may be substituted by an n-channel MOSFET if its conduction resistance is comparable to the former. If the n-channel MOSFET is used in the FIG. 13 embodiment, the phase of the pulse signal generated by the ATD 18 must be inverted with respect to that of the pulse signal generated by the ATD in the FIG. 13 embodiment. In the memory device of each of the above embodiments, the dummy cell is not always equivalent to the memory cell.

As seen from the foregoing description, in the memory device according to each of the above-mentioned embodiments, a rise of the reference potential Vref is held back even during the time of the row line switching. Accordingly, no noise is entered into the power source. A data read speed of the memory device is also improved.

Figure 15:
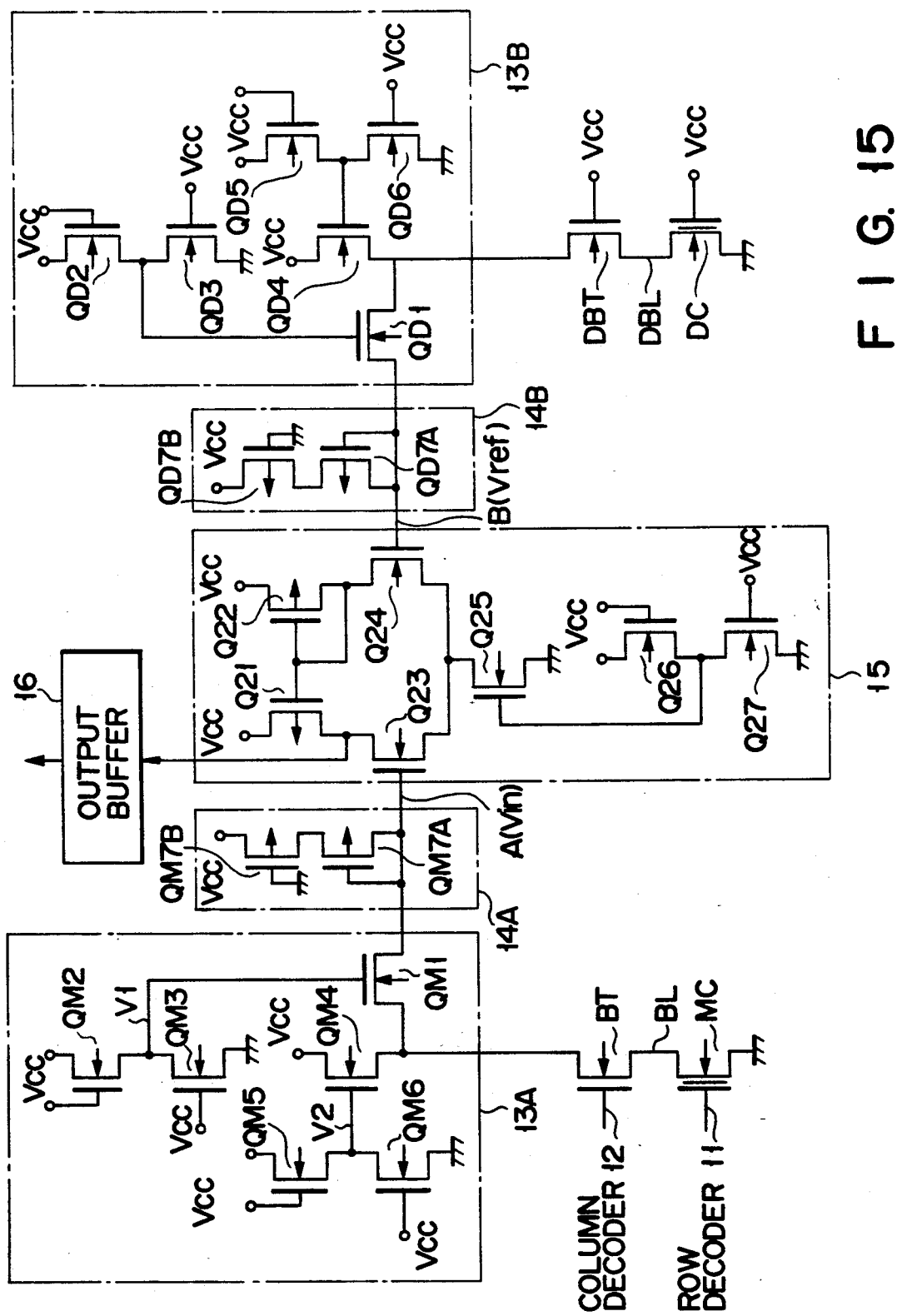
FIG. 15 shows a circuit diagram of a semiconductor memory device according to a further embodiment of the present invention.

FIG. 15 shows another embodiment of a semiconductor memory device according to the present invention. Also in this embodiment, the present invention is applied to an EPROM. In the illustration, the row decoder and the column decoder are omitted for simplicity. Further, a single memory cell MC and a single column gate MOSFET BT are typically used. The detailed circuit of the sense amplifier 15 is illustrated. The sense amplifier 15 thus arranged is applicable for any of the above-mentioned embodiments. The difference of the present embodiment from the above-mentioned embodiments resides in the circuit arrangements of the first and second load circuits 14A and 14B. Therefore, only one dummy cell DC is connected to the dummy column line DBL as in the conventional device shown in FIG. 1. As shown, in the first load circuit 14A, a pair of p-channel MOSFETs QM7A and QM7B are inserted in series between the power voltage Vcc and the node A. In the second load circuit 14B, a pair of p-channel MOSFETs QD7A and QD7B are connected in series between the power voltage Vcc and the node B. The MOS transistors QM7A and QD7A are connected at the gates the node A and B, respectively. The gates of the MOS transistors QM7B and QD7B are connected to ground.

The MOS transistors QM7A and QD7A are designed to have the same sizes. The size of each of the transistors QM7A and QD7A is much larger than that of each of the transistors QM7B and QD7B. In other words, the conduction resistance of the former is smaller than that of the latter. The transistor QM7B in the first load circuit 14A is so sized as to provide a potential of a "1" level, e.g, 1 V, at node A when a predetermined current flows into the memory cell MC. The transistor QD7B in the second load circuit 14B is so sized as to provide a mid potential at node B between the potential of the "1" level, e.g, 1 V, at node A when a predetermined current flows through the memory cell MC, and a potential of a "0" level (potential obtained by subtracting the threshold voltage of the p-channel MOS transistor from the power source voltage Vcc), e.g, 1 V, at node A when no current flows into the memory cell MC. The "size" used here means the channel width W of the MOS transistors when the channel length L thereof are equal to one another, and vice versa. Since the size of the transistor QM7B is smaller than that of the transistor QM7A in the load circuit 14A, a conduction resistance in the load circuit 14A is dominantly determined by the MOS transistor QM7B.

When in a memory selection, a memory cell of a high threshold voltage follows a memory cell of a low threshold voltage, a potential at the node A rises from the potential of the "1" level. When the potential at node A approaches to the potential of the "0" level (Vcc—the threshold voltage of the p-channel transistor), a conduction resistance of the transistor QM7A in the load circuit 14A becomes extremely large.

As described above, in the present embodiment, when the potential at node A is low, the MOS transistor QM7B dominantly determines a conduction resistance in the load circuit 14A. When the potential at node A rises, the conduction resistance of the load circuit 14A is dominantly determined by the conduction resistance of the transistor QM7A.

The sense amplifier 15 is made up of p-channel MOSFETs Q21 and Q22, and n-channel MOSFETs Q23 to Q27. The transistors Q21 to Q25 make up a differential amplifier. A general differential amplifier may be used for the differential amplifier. The transistors Q23 and Q24 make up a differential amplifier. The differential amplifier is grounded through the transistor Q25 which receives at the gate a bias potential as generated by the transistors Q26 and Q27.

FIG. 16 shows a voltage vs. load current characteristic of the load circuit 14A in the embodiment of FIG. 15. In the figure, the abscissa indicates a potential Vin at node A, while the ordinate a current flowing through the load circuit. Vin "1" level) denotes a potential at node A when a memory cell storing "1" data is selected and a current Icell flows through the selected memory cell. Vin ("0" level) denotes a potential at node A when a memory cell storing "0" data is selected. Vref denotes a potential at node B, which is an intermediate potential between the Vin ("1" level) and the Vin ("0" level). In the graph of FIG. 16, a solid line indicates the voltage vs. load current characteristic of the load circuit in the semiconductor memory of the FIG. 15 embodiment, and a dotted line indicates the voltage vs. load current characteristic of the load circuit in the conventional semiconductor memory of FIG. 1. As seen from the graph, the potential at node A, Vin ("1" level) in this embodiment is equal to that at node A in the conventional semiconductor memory device. As the potential Vin at node A rises from a "1" level, a load current flowing through the load circuit 14A more increases than that of the load circuit of the conventional memory device. Accordingly, when the column line BL is charged and a potential Vin at node A rises from Vin ("1" level), the potential Vin more steeply rises than that in the conventional memory device so that data can be read out at high speed. When the potential Vin at node A exceeds a potential Vref at node B, a conduction resistance of the MOS transistor QM7A in the load circuit 14a rapidly increases as in the conventional memory device, so that the load current decreases.

FIG. 17 shows a potential variation at node A of the embodiment of FIG. 15 when the column lines are switched from one to the other and a memory cell of a high threshold voltage is selected succeeding to a memory cell of a low threshold voltage. The potential variation at node A of the conventional memory device of FIG. 1 is indicated by a dotted line. Assume that at time t0, an input address changes, and at time t1, a new column line BL is selected. Until t1, a memory cell of a low threshold voltage is continuously selected. Accordingly, the potential Vin ("1" level) at node A is retained. At time t1, a new column line BL coupled with the memory cell of a high threshold voltage is selected, and then the column line BL is rapidly charged through the MOS transistor QM4 in the bias potential setting circuit 13A, during which the potential Vin at node A is once decreased below the Vin ("1" level). At time t2, the potential Vin at node A exceeds the potential Vref at node B. At this time, the output level of the sense amplifier 15 is inverted to produce the logic "0" data read out of the memory cell. In the conventional memory device of FIG. 1, at time t3 after time t2, the potential Vin at node A exceeds the potential Vref at node B, as shown by a dotted line in FIG. 17, and the output level of the sense amplifier 15 is inverted to output data.

The embodiment of FIG. 15 can speed up "0" data read operation by (t3−t2) when comparing with the conventional memory device of FIG. 1. With the increase of capacity of the semiconductor memory, capacitance connected to the column line has become large. In this case, the reading speed of the memory is determined by "0" data reading time in which the column line is charged from 0 volts. Therefore, the speed up of the data reading of "0" data finally speeds up the data reading of the semiconductor memory. Generally, the power voltage variation tends to occur when an external output capacitor connected to the output of the output buffer circuit is charged or discharged. In a high speed memory device, a time from the output of the sense amplifier is switched until the output of the buffer circuit is switched is very short. Therefore, the power voltage varies when the potential difference between nodes A and B is insufficient, and a malfunction will easily occur. As shown in FIG. 17, if the output of the buffer circuit is switched after ΔT has elapsed from when the potential Vin at node A is equal to the potential Vref at node B, the potential Vin at node A is higher by ΔV than that of the conventional memory device of FIG. 1. Therefore, even if the output of the buffer circuit is switched after ΔT from time t2, the potential Vin at node A in the device of the embodiment is sufficiently high. Therefore, if the power voltage varies due to the output switching of the buffer circuit, a malfunction of the memory device will not occur. This broadens the power noise margin of the semiconductor memory device.

Thus, a semiconductor memory device according to the embodiment of FIG. 15 is capable of reading data at a high speed and has a broad margin for the power noise.

Figure 18:
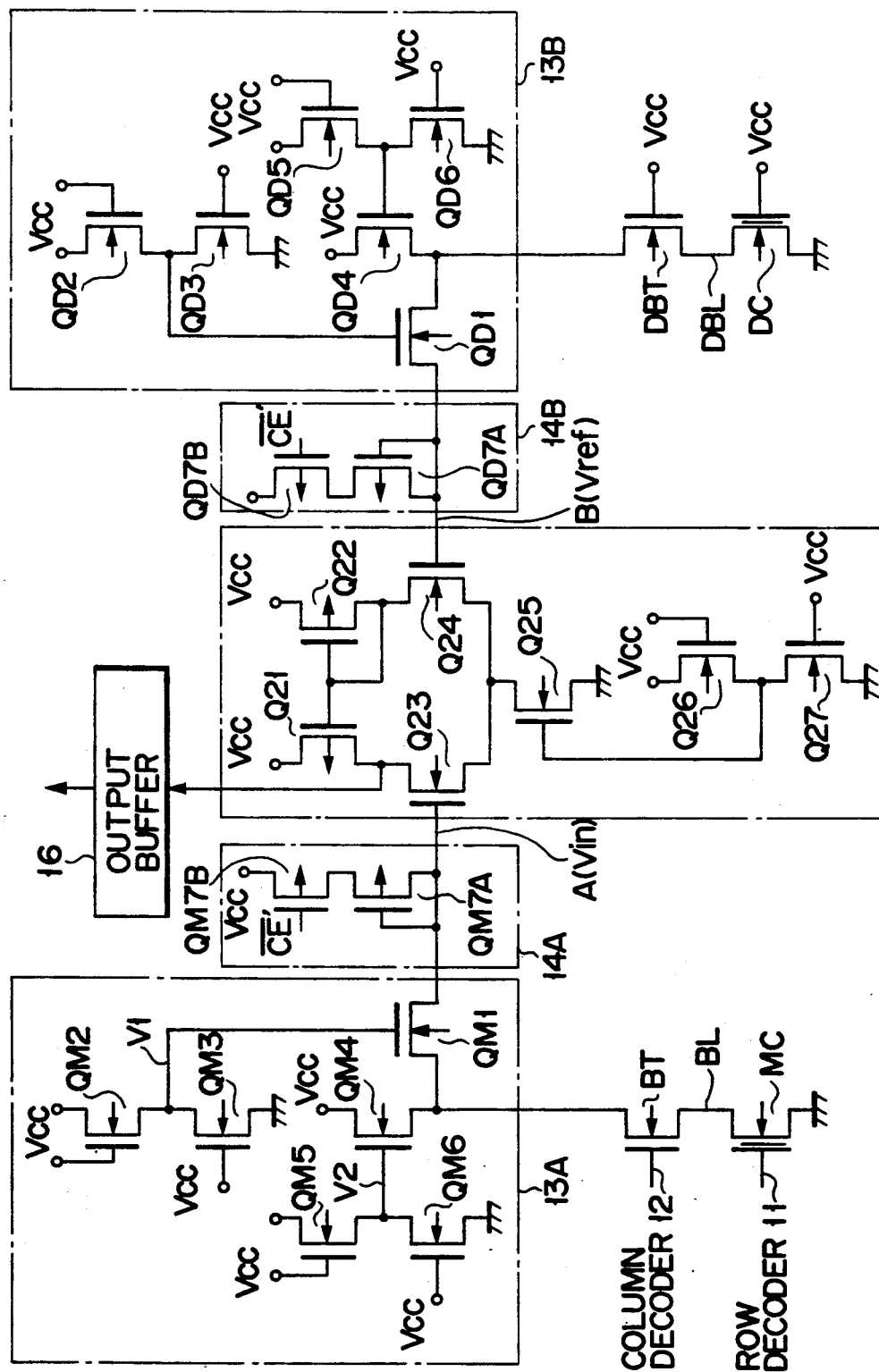
FIG. 18 is a circuit diagram of a semiconductor memory device according to a still further embodiment of the present invention.

FIG. 18 shows yet another embodiment of a semiconductor memory device according to the present invention. Also in this embodiment, the present invention is applied to an EPROM using MOSFETs of the double-layer structure containing a floating gate and a control gate. In FIG. 18, like reference symbols are used for designating like or equivalent portions in FIG. 15.

The present embodiment is featured in that the gates of the MOSFETs QM7B and QD7B in the first and second load circuits 14A and 14B are coupled for reception with control signals $\overline{CE'}$, whereas in the memory device of FIG. 15, the gates thereof are connected to ground. These control signals $\overline{CE'}$ controlled by a chip control signal $\overline{CE}$ supplied from outside, in such a manner that it is set at a ground potential when the memory device is in an active mode, and it is set at the power voltage Vcc when the memory device is in a stand-by mode. In an active mode of the memory device, since the control signal $\overline{CE'}$ is at a ground potential, the data read operation is performed as in the memory device of FIG. 15. In a stand-by mode of the memory device in which the control signal $\overline{CE'}$ is at the power voltage Vcc, the MOS transistors QM7B and QD7B are turned off. This fact indicates that in a stand-by mode, the power voltage Vcc causes no current, and therefore a power saving is realized.

Some specific modifications of the first load circuit 14A that are applicable for the semiconductor memory devices of FIGS. 15 and 18 are shown in FIGS. 19A to 19C.

In the load circuit of FIG. 19A, the p-channel MOSFET QM7B in FIG. 15 is replaced by a depletion type n-channel MOSFET QM8 whose threshold voltage is negative. The gate of the transistor QM8 is connected to its source. With this connection, when the potential at node A is low (e.g., 1 V), the transistor QM8 like the p-channel MOS transistor QM7B exhibits a substantially constant current load characteristic, and limits a current flowing through the load circuit 19A to provide the similar results to those of the embodiment of FIG. 15. A conduction resistance of the MOS transistor QM8 is so selected that when a predetermined current flows into the memory cell, a potential Vin at node A becomes a predetermined potential, e.g., 1 V.

The load circuit shown in FIG. 19B is featured in that an enhancement type n-channel MOS transistor QM9 with a gate connected to the power voltage Vcc is used in place of the p-channel MOS transistor QM7A, and a depletion type n-channel MOS transistor QM8 having a negative threshold voltage, in place of the p-channel MOS transistor QM7B in the FIG. 15 embodiment. The load circuit of FIG. 15B provides such a voltage-current characteristic as shown in FIG. 16, when the conduction resistance of the transistor QM9 is set higher than that of the transistor QM8. The conduction resistance of the MOS transistor QM8 is so selected that when a predetermined current flows into the memory cell, a potential Vin at node A becomes a predetermined potential.

In the above load circuit of FIG. 19B, a potential at node A when memory cell of a high threshold voltage is selected, is a potential that is by a threshold voltage of the n-channel MOS transistor lower than the power voltage Vcc. With such load circuits, all of the MOS transistors of the memory device may be of the n-channel. Accordingly, the memory device may be realized by an inexpensive n-channel MOS integrated circuit.

In the load circuit shown in FIG. 19C, a p-channel MOS transistor QM10 is inserted in series between the p-channel MOS transistors QM7A and QM7B in the embodiment of FIG. 15. The size of the transistor QM10 is set larger, like the transistor QM7A, than that of the transistor QM7B. The gate of the MOS transistor QM10 is connected to the drain. With the series-connected MOS transistor QM10, a potential at node A when a memory cell of a high threshold voltage is selected is lower than the power voltage Vcc by a voltage of the sum of the threshold voltages of the p-channel MOS transistors QM10 and QM7A. Use of the load circuit of FIG. 19C can reduce the amplification level at node A, and realize a high speed operation of the memory device even if the memory device uses a sense amplifier of a low circuit threshold voltage.

When the load circuit as shown in Figs 19A to 19C is used in place of the first load circuit 14A, it is preferable in view of the variation of the characteristic of the device that a load circuit whose structure is substantially the same as that of the load circuit shown in FIGS. 19A to 19C is used in place of the second load circuit 14B. Also in this case, a geometry of the transistor QM8 must be designed so that a potential Vref at node B is at a mid potential between a potential of the "1" level at node A when a predetermined current flows into the memory cell and a potential of the "0" level at node A when no current flows into the memory cell.

It should be understood that the present invention is not limited to the above-mentioned embodiments, but also be variously changed and modified within the scope and spirit of the invention. In the above embodiment, the conduction resistance may be set by applying a proper bias potential to the gate of the current limiting load transistor QM7B, in place of applying the ground potential to the gate. The memory cells of the nonvolatile semiconductor memory device of each embodiment as mentioned above are nonvolatile transistors of the double gate structure. The present invention is applicable for a mask ROM using the transistors of the single gate structure for the memory cells.

In the semiconductor memory devices of FIGS. 15 and 19A-19C thus far described, the load circuit is made up of a first load means and a second load means connected in series. The first load means presents a substantially constant current characteristic when a memory cell is sufficiently conductive and the potential at the data detecting node is low. The second load means sets a potential at the data sensing node at a potential by a preset value lower than the power voltage, when the memory cell is nonconductive. The memory device according to the present invention has a broad margin against a variation of the power voltage due to noise, and can readily realize a high speed operation.

Figure 20:
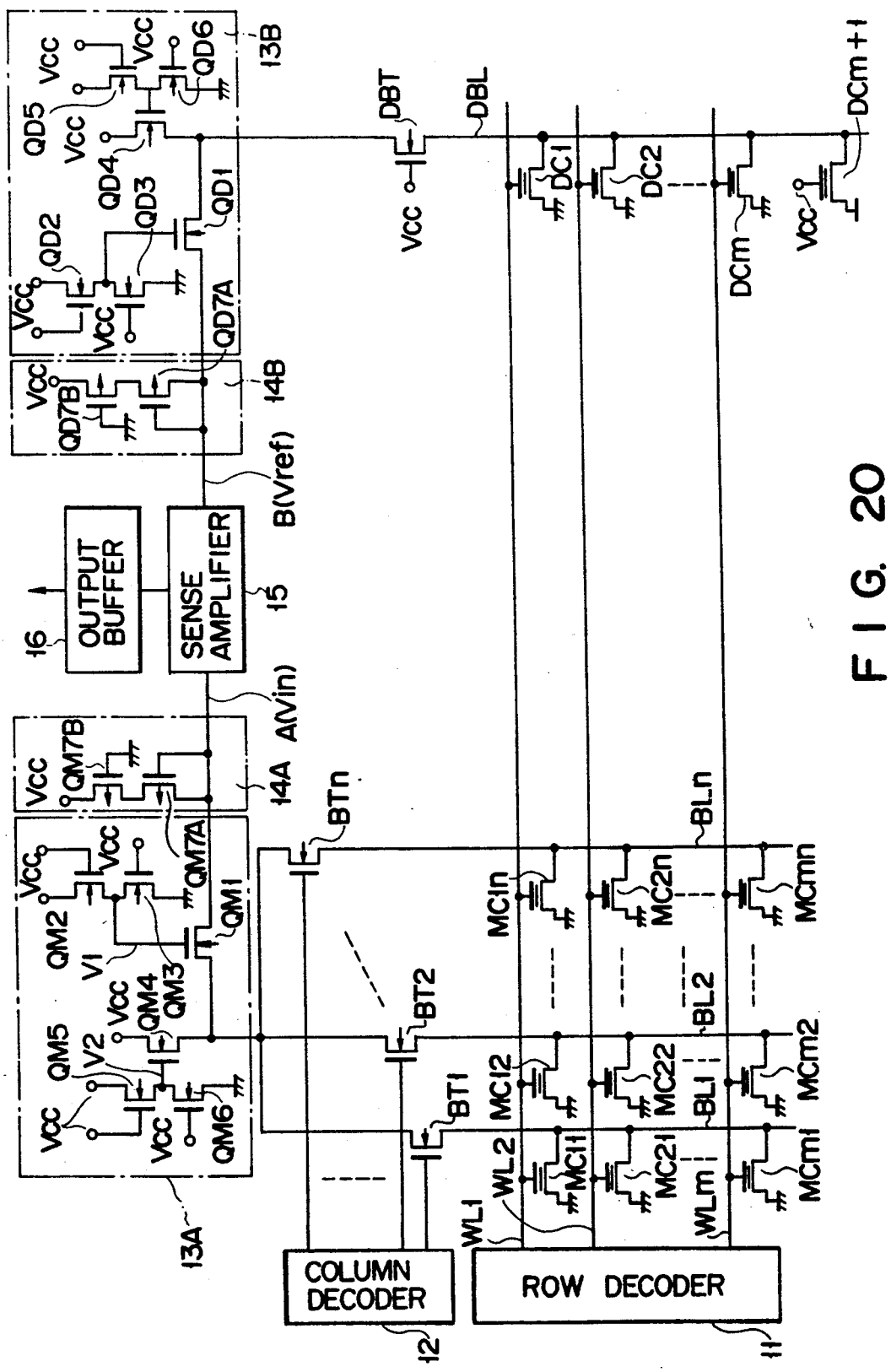
FIGS. 20 to 22 show circuit diagrams of semiconductor memory devices according to yet further embodiments of the present invention.
Figure 21:
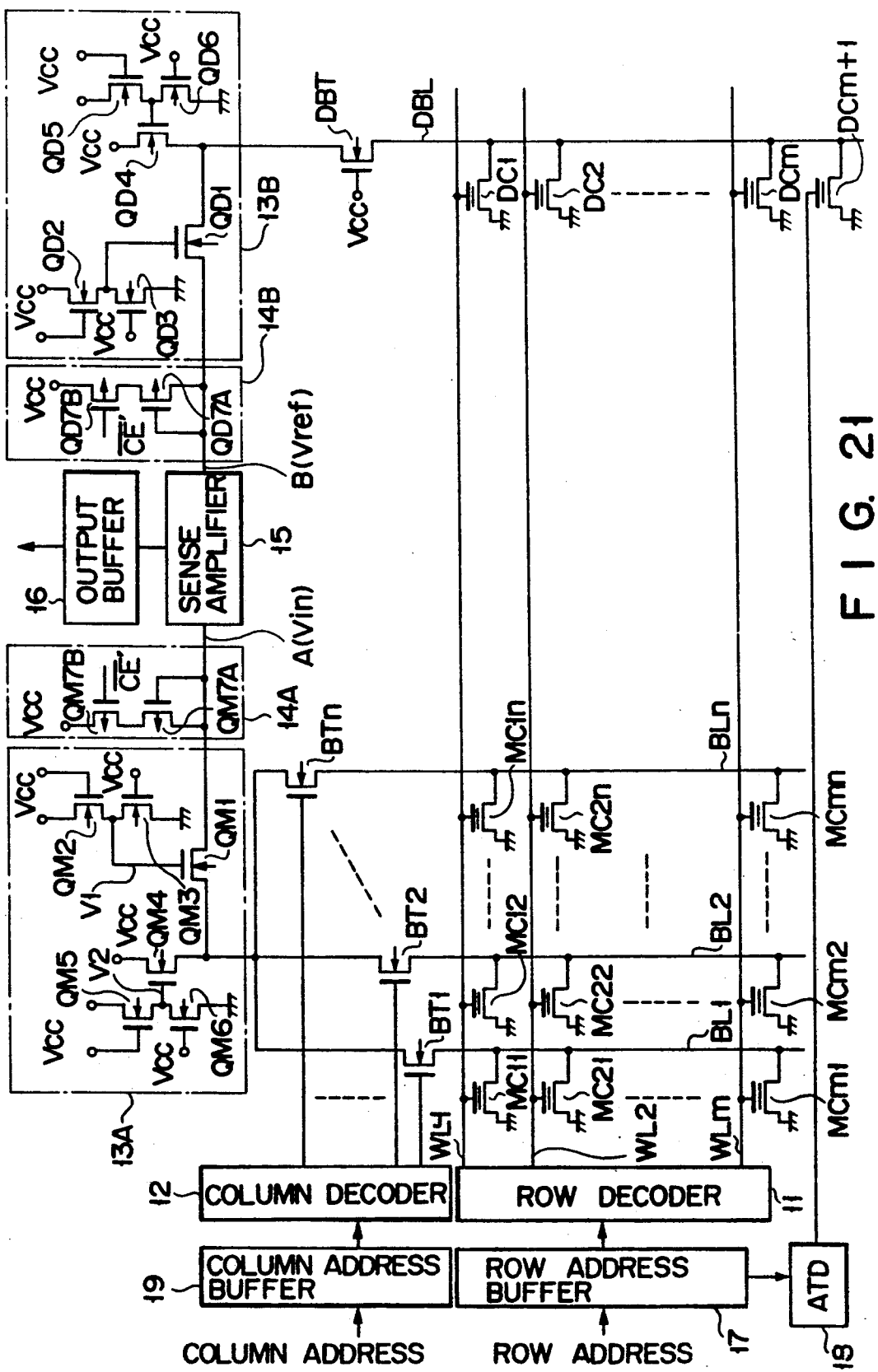

Semiconductor memory devices according to additional embodiments of the present invention are illustrated in FIGS. 20 and 21 The memory device of FIG. 20 corresponds to the combination of the circuit arrangements of FIGS. 15 and 17. As shown, the dummy column line DBL is connected to a dummy cell DCm+1 connected at the gate to the power voltage Vcc. A pair of the MOSFETs QM7A and QM7B are connected in series in the first load circuit 14A, and a pair of the MOSFETs QD7A and QD7B are connected also in series in the second load circuit 14B. The memory device of FIG. 21 corresponds to the combination of the circuit arrangements of FIGS. 12 and 18. As shown, the dummy column line DBL is connected to a dummy cell DCm+1 receiving at the gate an output pulse from the ATD 18. A pair of the MOSFETs QM7A and QM7B are connected in series in the first load circuit 14A, and a couple of the MOSFETs QD7A and QD7B are connected also in series in the second load circuit 14B Any of the load circuits shown in FIGS. 19A to 19C is applicable for the memory devices of FIGS. 20 and 21 For the operations of those memory devices, reference is made to those of FIGS. 7, 12, 15 and 18. In those embodiments, a rise of the reference potential Vref is held back even during the transient period of the row line switching, thereby rejecting the entry of power noise into the memory device. Also in those embodiments, the data is read out at high speed. Therefore, a broad margin is secured for the power voltage variation.

Figure 22:
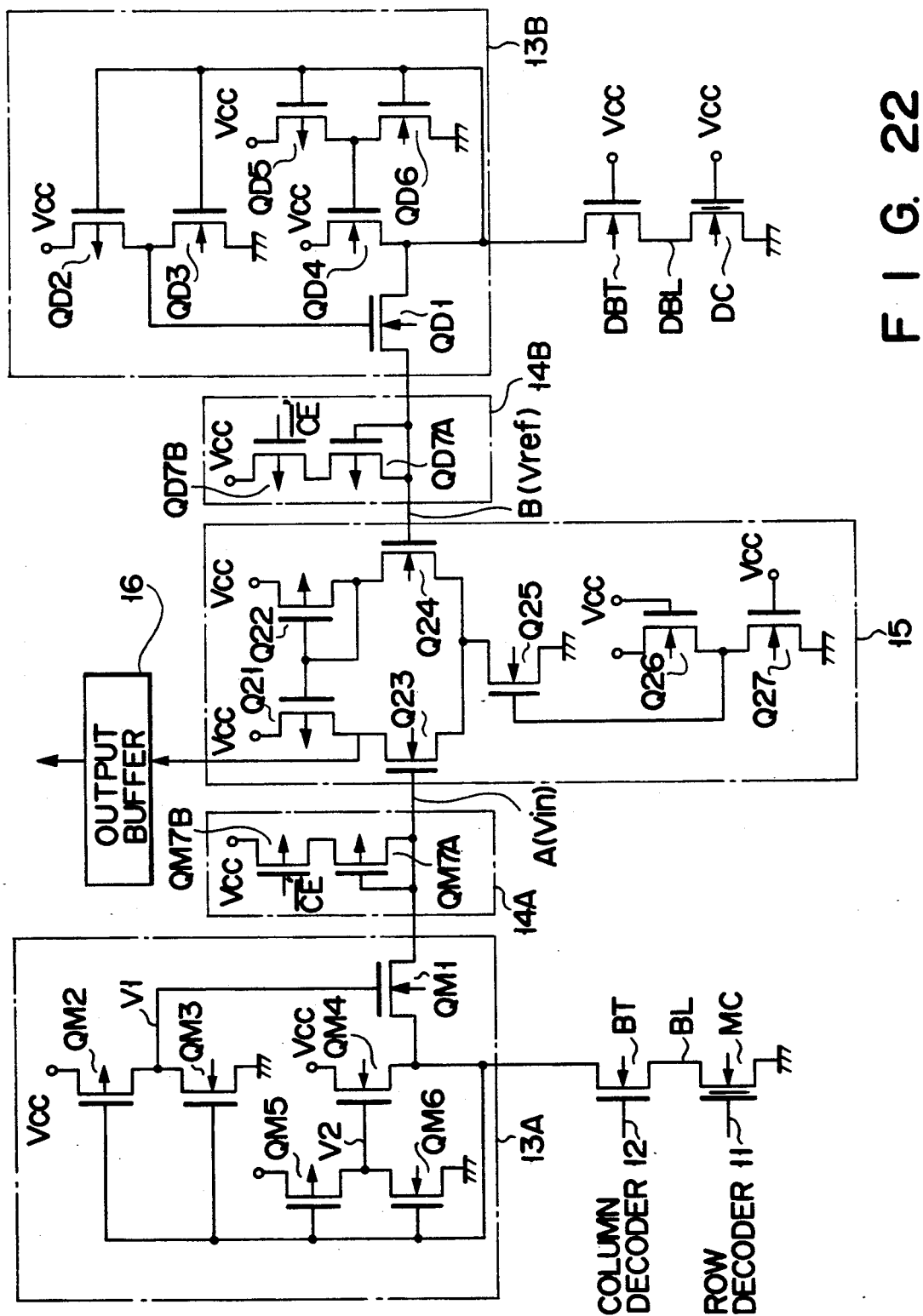

The semiconductor memory device shown in FIG. 22 is a further embodiment, in which a feedback type bias generator is used in place of the constant voltage generator in the bias setting circuits 13A and 13B of the circuit of the FIG. 18 embodiment. The bias generator produces an output whose potential is changed in accordance with the bit line potential. The constant voltage generator formed of the n-channel transistors QM5 and QM6 in the bias setting circuit 13A shown in FIG. 18 is replace by the feedback type bias generator circuit formed of p-channel transistor QM5 and n-channel transistor QM6 whose gates are connected to the drain of column gate transistor 12. Similarly, the constant voltage generator formed of the n-channel transistors QM2 and QM3 in the bias setting circuit 13A shown in FIG. 18 is replace by the feedback type bias generator circuit formed of p-channel transistor QM2 and n-channel transistor QM3 whose gates are connected to the drain of column gate transistor 12. A similar modification is performed in the bias setting circuit 13B. Specifically, the gates of p-channel transistors QD2 and QD5 and the gates of n-channel transistor QD3 and QD6 are connected to the drain of the n-channel transistor DBT.

With the bias circuit of the above structure, data reading speed can be enhanced, since the potential Vin at node A greatly changes with regard to a small change of the bit line potential. When, as shown in FIG. 22, the load circuit 14A is applied to the nonvolatile semiconductor device with the feedback type bias circuit, the operation speed of the semiconductor device can be significantly increased. Similarly, when the bias circuits 13A and 13B in the semiconductor circuit of FIG. 7 are replaced by the feedback type bias circuit shown in FIG. 22, it is possible to provide a high-speed nonvolatile semiconductor device which does not malfunction by a power source noise.

What is claimed is:

1. A semiconductor memory device comprising:
   a plurality of memory cells arranged in rows and columns;
   a plurality of row lines corresponding to the rows respectively, each row line connected to memory cells of a corresponding row;
   a plurality of column lines corresponding to the rows respectively, each column line connected to memory cells of a corresponding column;
   a plurality of first dummy cells, arranged in a column corresponding to the rows respectively, each first dummy cell connected to a corresponding one of the row lines, and one of the first dummy cells being turned on by a selected row line during a data-read mode;
   a dummy column line commonly connected to the plurality of first dummy cells;
   a second dummy cell having a drain connected to the dummy column line and a gate;
   means, coupled to the gate of the second dummy cell, for supplying a predetermined voltage for turning on the second dummy cell during the data-read mode;
   a first load circuit connected between the column lines and a power source line;
   a second load circuit connected between the dummy column line and the power source line; and
   a sense amplifier for sensing the data stored in the memory cell in accordance with a potential differences between the column line and the dummy column line.

2. A semiconductor memory device according to claim 1, wherein said predetermined voltage is a power source voltage.

3. A semiconductor memory device according to claim 1, wherein said predetermined voltage is a constant voltage different from a power source voltage.

4. A semiconductor memory device comprising:
   at least one memory cell;
   a first MOS transistor having a source-drain current path, one end of said source-drain current path being connected to a drain of said memory cell, the other end of said source-drain current path being connected to a data sensing node which potential varies according to a stored data in said memory cell, and said first MOS transistor receiving at the gate a first bias voltage;
   a load circuit for controlling a current flowing through said memory cell, said load circuit including a first load means for determining a potential of said sensing node by limiting a load current flowing through said load circuit and operating as a substantially constant current source when said memory cell is conductive, and said load circuit including a second load means for setting a potential of said sensing node below a potential of said first power source when said memory cell is nonconductive, the second load means having a first resistance when said memory cell is conductive and a resistance larger than the first resistance when said memory cell is nonconductive;
   a sense circuit for reading out the data from said memory cell, said sense circuit being connected to said sensing node.

5. A semiconductor device having first means for receiving a power voltage and second means for receiving a bias voltage lower than the power voltage, comprising:
   a memory cell having a drain;
   a data sensing node having a potential that varies according to data stored in the memory cell;
   a first MOS transistor having a source-drain current path and a gate, one end of the source-drain current path being connected to the drain of the memory cell, the other end of the source-drain current path being connected to the data sensing node, the gate being connected to the second means, the first MOS transistor being disposed to lower a drain voltage of the memory cell lower than the power voltage;

a load circuit including means for substantially limiting a current flowing through the load circuit and determining a low potential of the data sensing node when the memory cell is conductive including a first transistor having a first source-drain current path including a source, and a gate, the gate and source being connected such that a potential difference therebetween is independent of the potential of the data sensing node and, means for limiting a high potential of the data sensing node lower than the power source potential when the memory cell is non-conductive, including a second transistor having a second source-drain current path including a source, and a gate, the gate and source being connected such that a potential difference therebetween is dependent on the potential of the data sensing node, one end of the second source-drain current path being connected to one end of the first source drain current path, wherein the other ends of the first and second source-drain current paths are coupled between the data sensing node and the first means; and a sense circuit, coupled to the data sensing node, for reading binary data from the memory cell.

6. A semiconductor memory device according to claim 1, in which said first transistor is a p-channel MOS transistor biased at the gate by a fixed voltage lower than a voltage of said power source, and said second transistor is a p-channel MOS transistor having the gate connected to said sensing node.

* * * * *